US011495687B2

(12) United States Patent
Chen et al.

(10) Patent No.: US 11,495,687 B2
(45) Date of Patent: *Nov. 8, 2022

(54) METAL RAIL CONDUCTORS FOR NON-PLANAR SEMICONDUCTOR DEVICES

(71) Applicant: Taiwan Semiconductor Manufacturing Co., Ltd.

(72) Inventors: Chih-Liang Chen, Hsinchu (TW); Chih-Ming Lai, Hsinchu (TW); Ching-Wei Tsai, Hsinchu (TW); Charles Chew-Yuen Young, Cupertino, CA (US); Jiann-Tyng Tzeng, Hsin Chu (TW); Kuo-Cheng Chiang, Zhubei (TW); Ru-Gun Liu, Zhubei (TW); Wei-Hao Wu, Hsinchu (TW); Yi-Hsiung Lin, Zhubei (TW); Chia-Hao Chang, Hsinchu (TW); Lei-Chun Chou, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 4 days.

This patent is subject to a terminal disclaimer.

(21) Appl. No.: 17/001,390

(22) Filed: Aug. 24, 2020

(65) Prior Publication Data

US 2020/0388706 A1 Dec. 10, 2020

Related U.S. Application Data

(63) Continuation of application No. 16/176,072, filed on Oct. 31, 2018, now Pat. No. 10,763,365.
(Continued)

(51) Int. Cl.
*H01L 29/78* (2006.01)
*H01L 21/768* (2006.01)
(Continued)

(52) U.S. Cl.
CPC .... *H01L 29/7851* (2013.01); *H01L 21/76871* (2013.01); *H01L 21/823431* (2013.01);
(Continued)

(58) Field of Classification Search
CPC .......... H01L 29/7851; H01L 21/76871; H01L 21/823431; H01L 21/823475;
(Continued)

(56) References Cited

U.S. PATENT DOCUMENTS 10,804,402 B2 * 10/2020 Chen ................... H01L 27/0886
2015/0214105 A1 * 7/2015 Zhang ............... H01L 21/28518
257/754

(Continued)

FOREIGN PATENT DOCUMENTS

TW    I404128 B    8/2013
TW    I567775 B    1/2017
(Continued)

*Primary Examiner* — Herve-Louis Y Assouman
(74) *Attorney, Agent, or Firm* — Sterne, Kessler, Goldstein & Fox P.L.L.C.

(57) ABSTRACT

The present disclosure describes various non-planar semiconductor devices, such as fin field-effect transistors (finFETs) to provide an example, having one or more metal rail conductors and various methods for fabricating these non-planar semiconductor devices. In some situations, the one or more metal rail conductors can be electrically connected to gate, source, and/or drain regions of these various non-planar semiconductor devices. In these situations, the one or more metal rail conductors can be utilized to electrically connect the gate, the source, and/or the drain regions of various non-planar semiconductor devices to other gate, source, and/or drain regions of various non-planar semiconductor devices and/or other semiconductor devices. However, in other situations, the one or more metal rail conductors can be isolated from the gate, the source, and/or the drain regions these various non-planar semiconductor
(Continued)

devices. This isolation prevents electrical connection between the one or more metal rail conductors and the gate, the source, and/or the drain regions these various non-planar semiconductor devices.

20 Claims, 31 Drawing Sheets

Related U.S. Application Data

(60) Provisional application No. 62/592,744, filed on Nov. 30, 2017, provisional application No. 62/592,922, filed on Nov. 30, 2017.

(51) Int. Cl.
*H01L 21/8234* (2006.01)
*H01L 23/48* (2006.01)
*H01L 23/528* (2006.01)
*H01L 27/088* (2006.01)
*H01L 29/66* (2006.01)
*H01L 23/485* (2006.01)
*H01L 21/74* (2006.01)
*H01L 23/538* (2006.01)
*H01L 23/535* (2006.01)
*H01L 29/417* (2006.01)

(52) U.S. Cl.
CPC .... *H01L 21/823475* (2013.01); *H01L 23/481* (2013.01); *H01L 23/528* (2013.01); *H01L 23/5286* (2013.01); *H01L 23/535* (2013.01); *H01L 27/0886* (2013.01); *H01L 29/66795* (2013.01); *H01L 29/41791* (2013.01)

(58) Field of Classification Search
CPC . H01L 23/481; H01L 23/528; H01L 23/5286; H01L 23/535; H01L 27/0886; H01L 29/66795; H01L 29/41791
See application file for complete search history.

(56) References Cited

U.S. PATENT DOCUMENTS

| | | |
|---|---|---|
| 2017/0062325 A1 | 3/2017 | Greene |
| 2017/0062421 A1 | 3/2017 | Cosemans |
| 2018/0145030 A1 | 5/2018 | Beyne |
| 2018/0294267 A1 | 10/2018 | Licausi |
| 2018/0374791 A1 | 12/2018 | Smith |
| 2019/0012422 A1 | 1/2019 | Nayyar |
| 2019/0035785 A1 | 1/2019 | Ching |
| 2019/0067417 A1 | 2/2019 | Ching |
| 2019/0080969 A1 | 3/2019 | Tsao |

FOREIGN PATENT DOCUMENTS

| | | |
|---|---|---|
| WO | WO-2000/57451 A2 | 9/2000 |
| WO | WO-2009/102762 A2 | 8/2009 |
| WO | WO-2010/093380 A1 | 8/2010 |

* cited by examiner

METAL RAIL CONDUCTORS FOR NON-PLANAR SEMICONDUCTOR DEVICES

CROSS-REFERENCE TO RELATED APPLICATIONS

The present application is a continuation of U.S. Nonprovisional patent application Ser. No. 16/176,072, filed on Oct. 31, 2018, which claims the benefit of U.S. Provisional Patent Appl. No. 62/592,744, filed Nov. 30, 2017 and Provisional Patent Appl. No. 62/592,922, filed Nov. 30, 2017, all of which are also incorporated herein by reference in their entireties.

BACKGROUND

The semiconductor integrated circuit (IC) industry has experienced exponential growth. Technological advances in IC materials and design have produced generations of ICs, where each generation has smaller and more complex circuits than the previous generation. In the course of IC evolution, functional density (e.g., the number of interconnected devices per chip area) has generally increased while geometry size (e.g., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
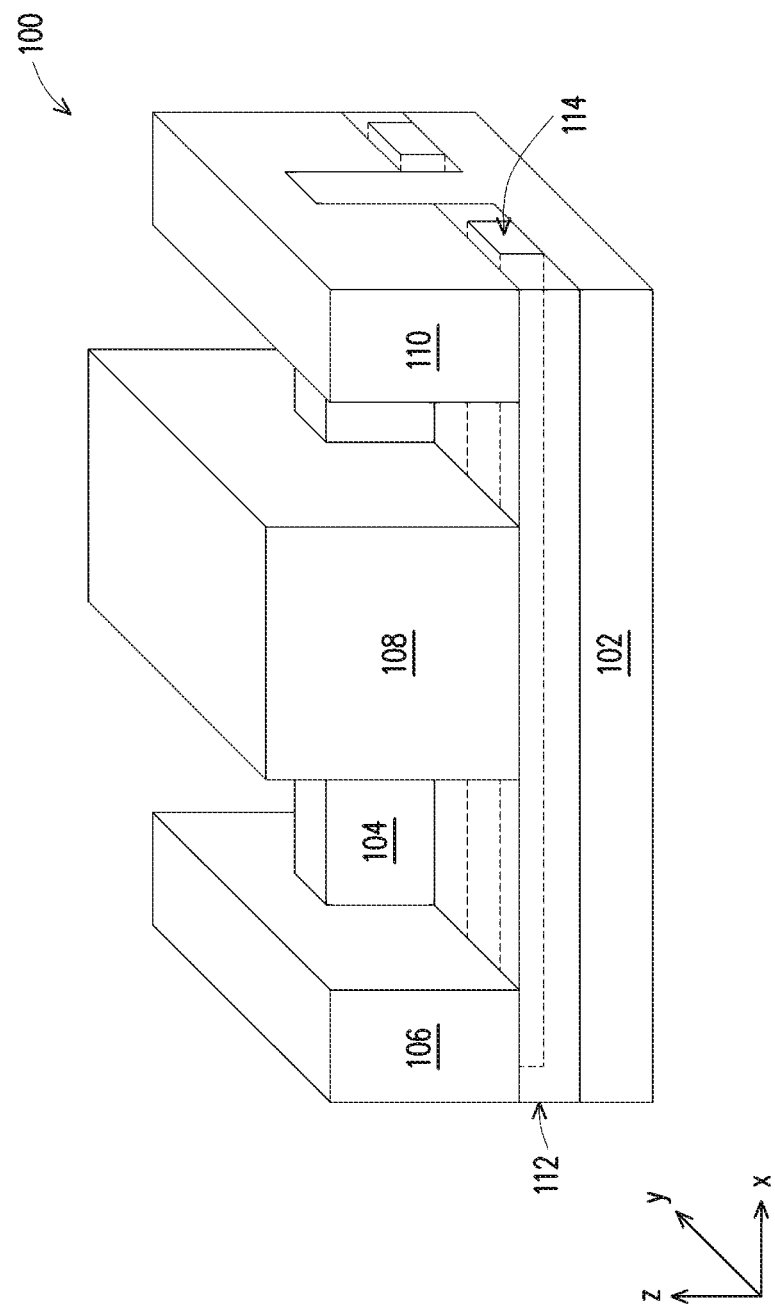
FIG. 1A illustrates an isometric view of an exemplary non-planar semiconductor device according to an exemplary embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is does not in itself dictate a relationship between the various embodiments and/or configurations described.

Overview

The present disclosure describes various non-planar semiconductor devices, such as fin field-effect transistors (finFETs) to provide an example, having one or more metal rail conductors and various methods for fabricating these non-planar semiconductor devices. In some situations, the one or more metal rail conductors can be electrically connected to gate, source, and/or drain regions of these various non-planar semiconductor devices. In these situations, the one or more metal rail conductors can be utilized to electrically connect the gate, the source, and/or the drain regions of various non-planar semiconductor devices to other gate, source, and/or drain regions of various non-planar semiconductor devices and/or other semiconductor devices. However, in other situations, the one or more metal rail conductors can be isolated from the gate, the source, and/or the drain regions these various non-planar semiconductor devices. This isolation prevents electrical connection between the one or more metal rail conductors and the gate, the source, and/or the drain regions these various non-planar semiconductor devices.

Exemplary Non-Planar Semiconductor Devices

FIG. 1A illustrates an isometric view of an exemplary non-planar semiconductor device according to an exemplary embodiment of the present disclosure. In the exemplary embodiment illustrated in FIG. 1A, a fin field-effect transistor (finFET) 100 represents a non-planar semiconductor device situated onto a dielectric region having one or more metal rail conductors. In some situations, the one or more metal rail conductors can be electrically connected to conductive structures such as, for example, gate, source, and/or drain regions of the finFET 100. In these situations, the one or more metal rail conductors can be utilized to electrically connect the gate, the source, and/or the drain regions of the finFET 100 to other gate, source, and/or drain regions of the finFET 100 and/or other semiconductor devices. However, in other situations, the dielectric region can isolate the one or more metal rail conductors from the gate, the source, and/or the drain regions of the finFET 100. This isolation prevents electrical connection between the one or more metal rail conductors and the gate, source, and/or drain regions of the finFET 100. In some embodiments, metal rail conductors can be formed using other suitable conductive material such as, for example, doped semiconductor material. As illustrated in FIG. 1A, the finFET 100 includes a semiconductor substrate 102, a fin structure 104, a source region 106, a gate region 108, a drain region 110, a dielectric region 112, and one or more metal rail conductors 114. However, the finFET 100 can include other regions, such as other dielectric regions and/or short trench isolation (STI) regions to provide some examples, without departing from the spirit and scope of the present disclosure. Although the description to follows describes the one or more metal rail conductors 114 in terms of a finFET, the one or more metal rail conductors 114 can be used in other non-planar semiconductor devices as well as planar semiconductor devices without departing from the spirit and scope of the present disclosure.

As illustrated in FIG. 1A, the fin structure 104, the source region 106, the gate region 108, the drain region 110, the dielectric region 112, and the one or more metal rail conductors 114 are situated on the semiconductor substrate 102. In the exemplary embodiment illustrated in FIG. 1A, the semiconductor substrate 102 can include one or more semiconductor materials, such as germanium (Ge), silicon carbide (SiC), gallium arsenide (GaAs), gallium phosphide (GaP), indium phosphide (InP), indium arsenide (InAs), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), indium antimonide (InSb), silicon germanium (SiGe), and/or any other suitable semiconductor material.

In the exemplary embodiment illustrated in FIG. 1A, the fin structure 104, the source region 106, the gate region 108, and the drain region 110 are arranged to form a fin field-effect transistor (finFET). The configuration of the fin structure 104, the source region 106, the gate region 108, and the drain region 110 as illustrated FIG. 1A are for illustrative purposes only. In some embodiments, other configurations for the fin structure 104, the source region 106, the gate region 108, and the drain region 110 can be included. As illustrated in FIG. 1A, the fin structure 104 passes through the gate region 108 in a horizontal direction, namely along the x-axis of the Cartesian coordinate system, between the source region 106 and the drain region 110. The fin structure 104 can include the one or more semiconductor materials as described above. In an exemplary embodiment, the fin structure 104 includes substantially similar semiconductor materials as the semiconductor substrate 102. Herein, a width of the fin structure 104, namely along a y-axis of a Cartesian coordinate system, is referred to as a fin width and a minimum pitch between adjacent fins allowed by lithography at a particular technology node, namely along a y-axis of the Cartesian coordinate system, is referred to as a fin pitch. Although the finFET 100 is illustrated as including the fin structure 104 in FIG. 1A, the finFET 100 can include more than one fin structure 104, in accordance with some embodiments.

In an exemplary embodiment, the source region 106 and/or the drain region 110 can include one or more epitaxial materials, such as epitaxial silicon (Si), epitaxial silicon germanium (SiGe), gallium arsenide (GaAs), and/or any other suitable epitaxial material. Alternatively, or in addition to, in another exemplary embodiment, the gate region 108 can include one or more p-type work function metals and/or one or more n-type work function metals. The p-type work function metals can include titanium nitride (TiN), tantalum nitride (TaN), ruthenium (Ru), molybdenum (Mo), aluminum (Al), tungsten nitride (WN), zirconium disilicide ($ZrSi_2$), molybdenum disilicide ($MoSi_2$), tantalum disilicide ($TaSi_2$), nickel disilicide ($NiSi_2$), platinum (Pt), and/or any other suitable p-type work function metal, in accordance with some embodiments. The n-type work function metals can include aluminum (Al), titanium (Ti), silver (Ag), tantalum aluminum (TaAl), tantalum aluminum carbon (TaAlC), tantalum aluminum nitride (TiAlN), tantalum carbide (TaC), tantalum carbide nitride (TaCN), tantalum silicide nitride (TaSiN), manganese (Mn), zirconium (Zr), and/or any other suitable n-type work function metal, in accordance with some embodiments. Alternatively, or in addition to, in a further exemplary embodiment, the gate region 108 can include one or more polycrystalline materials, such as polycrystalline silicon to provide an example. As additionally illustrated in FIG. 1A, the source region 106, the gate region 108, and the drain region 110 are situated on the dielectric region 112 with the fin structure 104 traversing through the dielectric region 112 onto the semiconductor substrate 102. The dielectric region 112, also referred to as an interlayer dielectric (ILD) region, can include one or more dielectric materials such as silicon oxide, spin-on-glass, silicon nitride, silicon carbide, silicon carbon nitride, silicon oxynitride, silicon oxycarbide, fluorine-doped silicate glass (FSG), a low-k dielectric material, and/or any other suitable dielectric material, in accordance with some embodiments. Although not illustrated in FIG. 1A, other dielectric regions can be situated between the semiconductor substrate 102 and the dielectric region 112, in accordance with some embodiments.

Moreover, the one or more metal rail conductors 114 are situated within the dielectric region 112 as illustrated in FIG. 1A. The one or more metal rail conductors 114 can include as tungsten (W), cobalt (Co), copper (Cu), aluminum (Al), and/or any other suitable conductive, or semi-conductive, material, in accordance with some embodiments. For example, one or more metal rail conductors 114 can be formed using highly-doped silicon material. In the exemplary embodiment illustrated in FIG. 1A, the one or more metal rail conductors 114 includes two metal rail conductors situated within the dielectric region 112. However, the number of rail conductors of the one or more metal rail conductors 114 can differ depending upon application, in accordance with some embodiments.

As illustrated in FIG. 1A, the one or more metal rail conductors 114 traverse a length of the semiconductor substrate 102 in the horizontal direction, namely along the x-axis of the Cartesian coordinate system, between the source region 106 and the drain region 110. In the exemplary embodiment illustrated in FIG. 1A, the one or more metal rail conductors 114 are situated to be parallel (e.g., extending in the same direction) to the fin structure 104. However, the one or more metal rail conductors 114 can be situated to be perpendicular to the fin structure 104, in accordance with some embodiments. In these situations, the one or more metal rail conductors 114 traverse through the fin structure 104.

As to be described in further detail below in FIG. 1B, the dielectric region 112 can be configured to isolate the source region 106, the gate region 108, and/or and the drain region 110 and the one or more metal rail conductors 114 to prevent electrical connection between the source region 106, the gate region 108, and/or and the drain region 110 and the one or more metal rail conductors 114. And as to be described in further detail below in FIG. 1C, the source region 106, the gate region 108, and/or and the drain region 110 can be electrically connected to the one or more metal rail conductors 114 to provide electrical connection between the source region 106, the gate region 108, and/or and the drain region 110 and the one or more metal rail conductors 114. In an exemplary embodiment, widths, namely along the y-axis of the Cartesian coordinate system, of the one or more metal rail conductors 114 are between approximately 0.8 and approximately 2.2 times the fin width. In this exemplary embodiment, a separation between adjacent metal rail conductors from among the one or more metal rail conductors 114 is between approximately 0.8 and approximately 1.2 times the fin pitch. Also, in this exemplary embodiment, heights, namely along the z-axis of the Cartesian coordinate system, of the one or more metal rail conductors 114 is between approximately 0.8 and approximately 1.2 times a gate pitch, namely a minimum pitch between adjacent gate regions allowed by lithography at the particular technology node, namely along the x-axis and/or the y-axis of the Cartesian coordinate system.

In the exemplary embodiment illustrated in FIG. 1A, the one or more metal rail conductors 114 have a substantially similar length, namely along the x-axis of the Cartesian coordinate system. However, lengths of the one or more metal rail conductors 114 can differ, in accordance with some embodiments. In an exemplary embodiment, the one or more metal rail conductors 114 have a substantially similar length, namely along the x-axis of the Cartesian coordinate system, as the semiconductor substrate 102. In this exemplary embodiment, the one or more metal rail conductors 114 can be electrically and/or mechanically connected to other metal rail conductors of one or more other finFETs to form an interconnected network of metal rail conductors. This interconnected network of metal rail conductors can be used to electrically connect various conductive structures such as, for example, gate, source, and/or drain regions of these finFETs to form one or more integrated circuits. These integrated circuits can include basic logical gates, such as logical AND gates, logical OR gates, logical XOR gates, logical XNOR gates, or logical NOT gates to provide some examples, as well as other more complicated logical circuitry. This interconnected network of metal rail conductors allows these electrically connections between the various gate, source, and/or drain regions of these finFETs to be made without traversing through conventional metal layers which are conventionally available for routing signals. As such, the interconnected network of metal rail conductors lessens the area in terms of real estate necessary to form the one or more integrated circuits when compared to using the conventional metal layers to form these electrically connections between the various source regions and/or drain regions of the se finFETs.

Figure 1C:
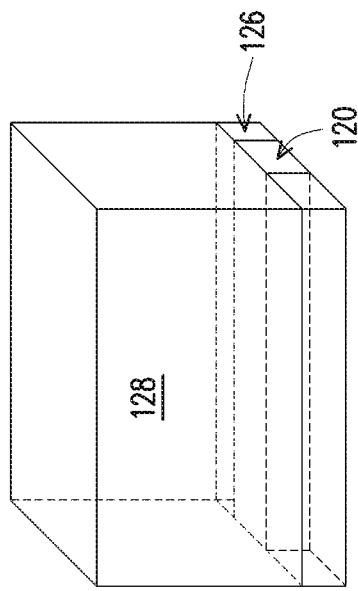
FIG. 1C illustrates an isometric view of a dielectric region within the exemplary non-planar semiconductor device according to an exemplary embodiment of the present disclosure.
Figure 1B:
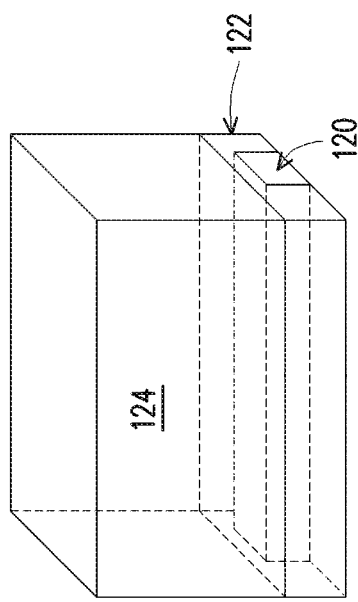
FIG. 1B illustrates an isometric view of a dielectric region within the exemplary non-planar semiconductor device according to an exemplary embodiment of the present disclosure.

FIG. 1B illustrates an isometric view of a first configuration of a dielectric region within the exemplary non-planar semiconductor device according to an exemplary embodiment of the present disclosure. As described in FIG. 1A, the finFET 100 includes the fin structure 104, the source region 106, the gate region 108, the drain region 110, the dielectric region 112, and the one or more metal rail conductors 114 situated on the semiconductor substrate 102. A metal rail conductor 120 and a dielectric region 122 as illustrated in FIG. 1B can represent exemplary embodiments of the one of the one or more metal rail conductors 114 and dielectric region 112 and respectively, as described above in FIG. 1A. Similarly, a terminal region 124 as illustrated in FIG. 1B can represent an exemplary embodiment of the source region 106, the gate region 108, and/or and the drain region 110 as described above in FIG. 1A.

Referring to FIG. 1B, the dielectric region 122 is configured to prevent electrical connection between the metal rail conductor 120 and the terminal region 124. In the exemplary embodiment illustrated in FIG. 1B, the dielectric region 122 effectively isolates the metal rail conductor 120 from the terminal region 124 to prevent the electrical connection.

FIG. 1C illustrates an isometric view of a second configuration of a dielectric region within the exemplary non-planar semiconductor device according to an exemplary embodiment of the present disclosure. As described in FIG. 1A, the finFET 100 includes the fin structure 104, the source region 106, the gate region 108, the drain region 110, the dielectric region 112, and the one or more metal rail conductors 114 situated on the semiconductor substrate 102. The metal rail conductor 120 and a dielectric region 126 as illustrated in FIG. 1C can represent exemplary embodiments of the one of the one or more metal rail conductors 114 and dielectric region 112 and respectively, as described above in FIG. 1A. Similarly, a terminal region 128 as illustrated in FIG. 1C can represent an exemplary embodiment of the source region 106, the gate region 108, and/or and the drain region 110 as described above in FIG. 1A.

Referring to FIG. 1C, the source region 106, the metal rail conductor 120 can be electrically connected to the terminal region 128 to provide electrical connection between the metal rail conductor 120 and the terminal region 128. In the exemplary embodiment illustrated in FIG. 1B, the metal rail conductor 120 is sufficiently exposed within the dielectric region 126 to electrically connect to the terminal region 128 to provide the electrical connection. As to be described in more detail below, a portion of dielectric region 126 can be removed through a patterning process, such as a dry etch or a wet etch to provide some examples, during fabrication to expose the portion of the dielectric region 126. Thereafter, the terminal region 128 can be deposited onto the portion of the dielectric region 126 through a deposition where material is grown, coated, or otherwise transferred. In an exemplary embodiment, a height, namely along the z-axis of the Cartesian coordinate system as illustrated in FIG. 1A, of the terminal region 128 as illustrated in FIG. 1C is greater than a height of the terminal region 124 as illustrated in FIG. 1B. In this exemplary embodiment, this difference in height between the terminal region 124 and the terminal region 128 results from removing sufficient portions of the dielectric region 126 to expose the metal rail conductor 120 to allow the electrical connection between the metal rail conductor 120 and the terminal region 128.

Figure 1D:
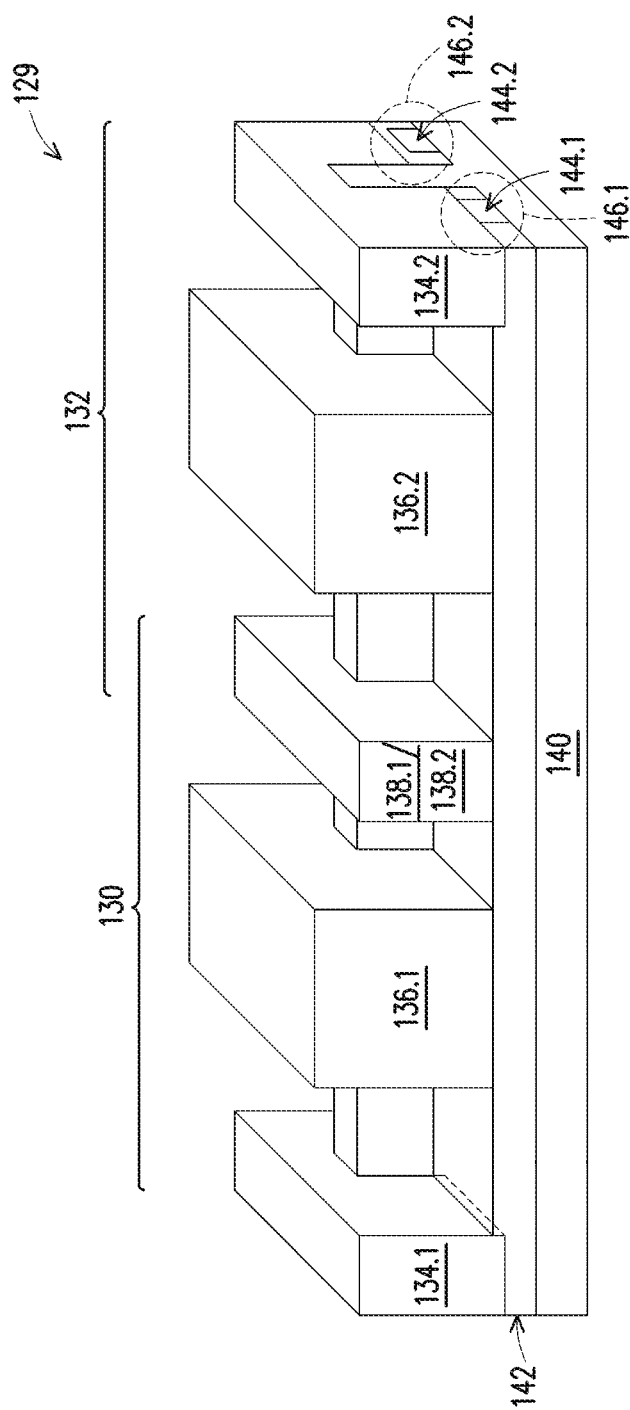
FIG. 1D and FIG. 1E illustrate isometric views of a first exemplary integrated circuit and a second exemplary integrated circuit, respectively, each having non-planar semiconductor devices according to an exemplary embodiment of the present disclosure.
Figure 1E:
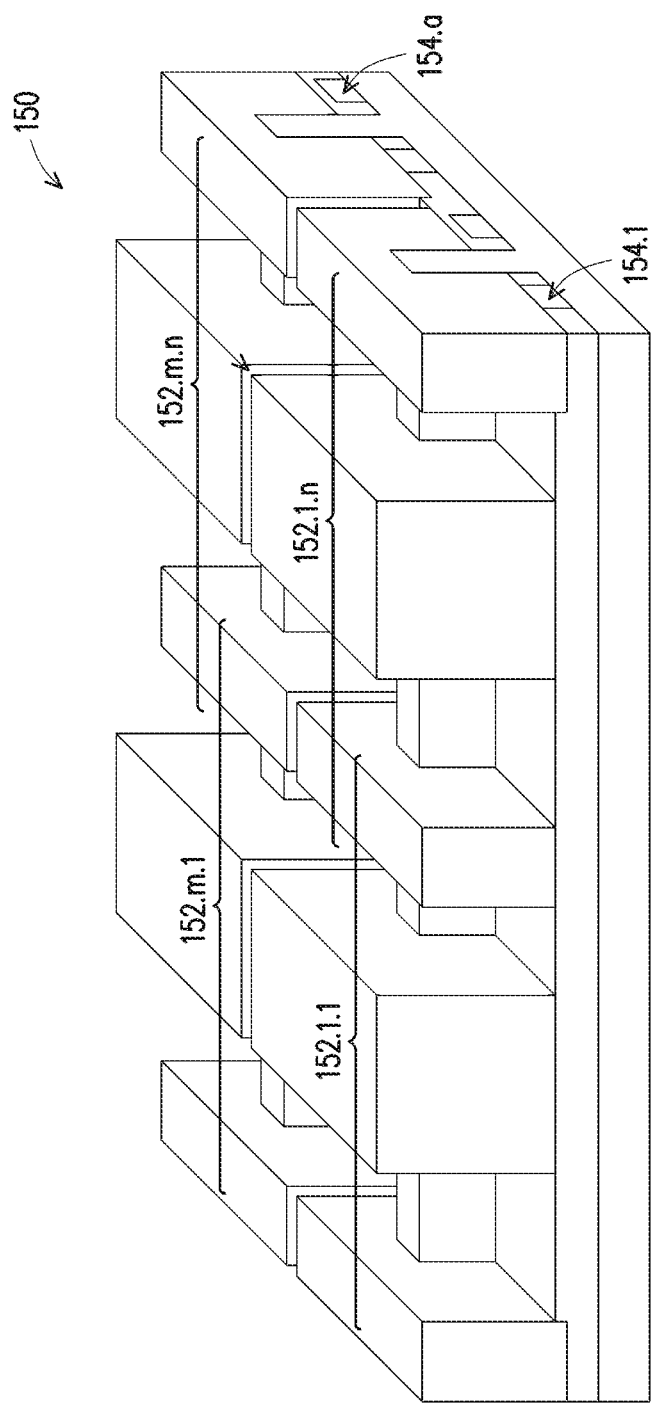

FIG. 1D and FIG. 1E illustrate isometric views of a first exemplary integrated circuit and a second exemplary integrated circuit, respectively, each having non-planar semiconductor devices according to an exemplary embodiment of the present disclosure.

In the exemplary embodiment illustrated in FIG. 1D, an integrated circuit 129 includes non-planar semiconductor devices situated onto a dielectric region having multiple metal rail conductors situated within. The dielectric region can be selectively configured to allow electrical connection between the multiple metal rail conductors and gate, source, and/or drain regions of the non-planar semiconductor devices or to prevent the electrical connection between the multiple metal rail conductors and gate, source, and/or drain regions of the non-planar semiconductor devices. In the exemplary embodiment illustrated in FIG. 1D, the integrated circuit 129 includes a first finFET 130, having a source region 134.1, a gate region 136.1, and a drain region 138.1, and a second finFET 132, having a source region 134.2, a gate region 136.2, and a drain region 138.2, and a dielectric region 142 situated onto a semiconductor substrate 140. It should be noted that the integrated circuit 129 as illustrated in FIG. 1D is for exemplary purposes only and the integrated circuit 129 can include more finFETs configured in a substantially similar manner as the first finFET 130 and the second finFET 132. In the exemplary embodiment illustrated in FIG. 1D, the first finFET 130 and the second first finFET 132 can represent exemplary embodiments of the finFET 100 as described above in FIG. 1A. As such, the source region 134.1 and the source region 134.2 can represent exemplary embodiments of the source region 106 as described above in FIG. 1A, the gate region 136.1 and the gate region 136.2 can represent exemplary embodiments of the gate region 108 as described above in FIG. 1A, and the drain region 138.2 and the drain region 138.1 can represent exemplary embodiments of the drain region 110 as described above in FIG. 1A. As illustrated in FIG. 1D, the drain region 138.1 and the drain region 138.2 can be characterized as being a common drain region which is shared between the first finFET 130 and the second finFET 132.

As illustrated in FIG. 1D, the integrated circuit 129 further includes metal rail conductors 144.1 and 144.2 situated within the dielectric region 142. The metal rail conductors 144.1 and 144.2 can represent exemplary embodiments of the one or more metal rail conductors 114 as described above in FIG. 1A. In the exemplary embodiment illustrated in FIG. 1D, the metal rail conductors 144.1 and 144.2 traverse a length of the semiconductor substrate 140 in the horizontal direction, namely along the x-axis of the Cartesian coordinate system as illustrated in FIG. 1A, between the source region 134.1 and the source region 134.2. In the exemplary embodiment illustrated in FIG. 1D and as illustrated in circle 146.1 in FIG. 1D, the metal rail conductor 144.1 can be electrically connected to the source region 134.2 to provide electrical connection between the source region 134.2 and the metal rail conductor 144.1 as described above in FIG. 1C. In this exemplary embodiment, the metal rail conductor 144.1 can be electrically connected to the source region 134.1 to provide electrical connection between the source region 134.1 and the metal rail conductor 144.1 as described above in FIG. 1C. As such, the metal rail conductor 144.1 provides an electrical connection between the source region 134.1 and the source region 134.2. However, in the exemplary embodiment illustrated in FIG. 1D and as illustrated in circle 146.2 in FIG. 1D, the dielectric region 142 is configured to prevent electrical connection between the metal rail conductor 144.2 and the source region 134.1 as described above in FIG. 1B. In this situation, the dielectric region 142 effectively isolates the metal rail conductor 144.2 from the source region 134.2 to prevent the electrical connection between the metal rail conductor 144.2 and the source region 134.1. It should be noted that although only source region 134.2 is shown to be electrically connected to metal rail conductor 144.1 in FIG. 1D, other source/drain terminals can also be connected to metal rail conductors depending on the needs of circuitry design and device configuration. Because the metal rail conductors are formed within the dielectric region 142, they can electrically connect multiple source/drain terminals without occupying additional device space.

As illustrated in FIG. 1E, an integrated circuit 150 includes finFETs 152.1.1 through 152.m.n that are arranged in an array of m rows and n columns. However, other arrangements for the finFETs 152.1.1 through 152.m.n are possible without departing from the spirit and scope of the present disclosure. In this exemplary embodiment, each of the m rows includes one or more metal rail conductors from among the one or more metal rail conductors 154.1 through 154.a. In the exemplary embodiment illustrated in FIG. 1E, each of the finFETs 152.1.1 through 152.m.n can represent an exemplary embodiment of the finFET 100 as described above in FIG. 1A and/or of the first finFET 130 and the second finFET 132 as described above in FIG. 1D. It should be noted that although one source region of finFETs 152.m.n is shown to be electrically connected to metal rail conductor 154.1 in FIG. 1E, other source/drain terminals can also be connected to metal rail conductors depending on the needs of circuitry design and device configuration. Because the metal rail conductors are formed within the dielectric region, they can electrically connect multiple source/drain terminals without occupying additional device space.

Figure 2:
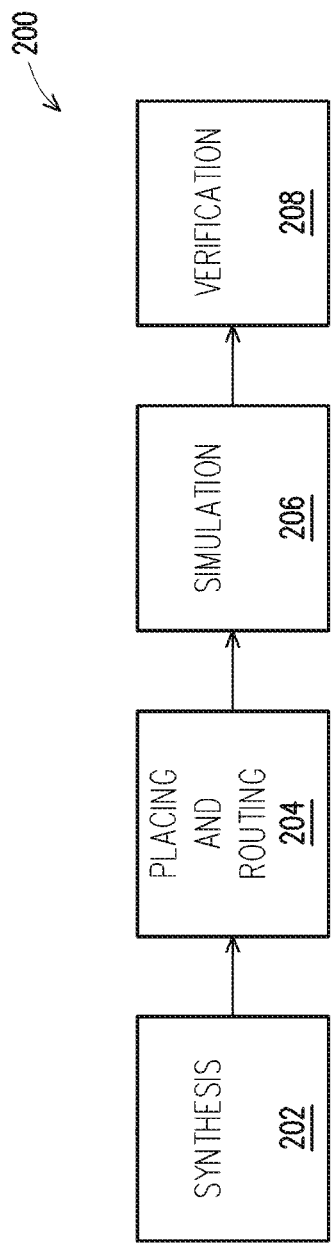
FIG. 2 illustrates a block diagram of an electronic design platform according to an exemplary embodiment of the present disclosure.

Electronic Design Platform for Forming Integrated Circuits having the Exemplary Non-Planar Semiconductor Devices FIG. 2 illustrates a block diagram of an electronic design platform according to an exemplary embodiment of the present disclosure. As illustrated in FIG. 2, an electronic design platform 200 represents a design flow including one or more electronic design software applications, that when executed by one or more computing devices, processors, controllers, or other devices that will be apparent to those skilled in the relevant art(s) without departing from the spirit and the scope of the present disclosure, can design, simulate, analyze, and/or verify one or more high-level software level descriptions of analog and/or digital circuitry for an electronic device. In an exemplary embodiment, the one or more high-level software level descriptions can be implemented using a high-level software language, such as a graphical design application, for example C, System C, C++, LabVIEW, and/or MATLAB, a general purpose system design language, such as like SysML, SMDL and/or SSDL, or any other suitable high-level software or general purpose system design language that will be apparent to those skilled in the relevant art(s) without departing from the spirit and the scope of the present disclosure, or a high-level software format, such as Common Power Format (CPF), Unified Power Formant (UPF), or any other suitable high-level software format that will be apparent to those skilled in the relevant art(s) without departing from the spirit and the scope of the present disclosure. In the exemplary embodiment illustrated in FIG. 2, the electronic design platform 200 includes a synthesis application 202, a placing and routing application 204, a simulation application 206, and a verification application 208.

Moreover, embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc. In an exemplary embodiment, the synthesis application 202, the placing and routing application 204, the simulation application 206, and the verification application 208 represent one or more electronic design software applications, which when executed by one or more computing devices, processors, controllers, or other devices that will be apparent to those skilled in the relevant art(s) without departing from the spirit and the scope of the present disclosure, configure the one or more computing devices, the processors, the controllers, or the other devices from being general purpose electronic devices into special purpose electronic devices to execute one or more of these applications as to be described in further detail below.

The synthesis application 202 translates one or more characteristics, parameters, or attributes of the electronic device into one or more logic operations, one or more arithmetic operations, one or more control operations, and/or any other suitable operation or operations that will be apparent to those skilled in the relevant art(s) without departing from the spirit and the scope of the present disclosure into the one or more high-level software level descriptions in terms of analog circuitry and/or digital circuitry of the electronic device. The synthesis application 202 can utilize a simulation algorithm to simulate the one or more logic operations, one or more arithmetic operations, one or more control operations, and/or the other suitable operation or operations to verify the one or more logic operations, one or more arithmetic operations, one or more control operations, and/or the other suitable operation perform in accordance with one or more characteristics, parameters, or attributes of the electronic device as outlined in an electronic design specification.

The placing and routing application 204 translates the one or more high-level software level descriptions to form an electronic architectural design for the analog circuitry and/or the digital circuitry of the electronic device. The placing and routing application 204 selectively chooses among one or more standard cells within libraries of standard cells to translate the one or more logic operations, the one or more arithmetic operations, the one or more control operations, and/or the other suitable operation or operations of the one or more high-level software level descriptions into geometric shapes and/or the interconnections between the geometric shapes to form the electronic architectural design for the analog circuitry and/or the digital circuitry of the electronic device. In an exemplary embodiment, at least one of the one or more standard cells includes one or more non-planar semiconductor devices, such as the finFET 100 to provide an example. In this exemplary embodiment, various conductive structures such as, for example, source regions, gate regions, and/or drain regions of the one or more non-planar semiconductor devices can be electrically connected to one or more metal rail conductors, such as the one or more metal rail conductors 114 to provide an example, within the one or more non-planar semiconductor devices as described above in FIGS. 1A to 1E.

After selecting the one or more standard cells from the among libraries of standard cells, the placing and routing application 204 places the one or more selected standard cells onto an electronic device design real estate. Thereafter, the placing and routing application 204 routes various interconnections between the one or more selected standard cells in accordance with the one or more logic operations, the one or more arithmetic operations, the one or more control operations, and/or the other suitable operation or operations of the one or more high-level software level descriptions to form the electronic architectural design for the analog circuitry and/or the digital circuitry of the electronic device. In an exemplary embodiment, the placing and routing application 204 can electrically connect the one or more metal rail conductors between adjacent standard cells from among the one or more selected standard cells.

The simulation application 206 simulates the electronic architectural design for the analog circuitry and/or the digital circuitry of the electronic device to replicate one or more characteristics, parameters, or attributes of the electronic architectural design for the analog circuitry and/or the digital circuitry of the electronic device. In an exemplary embodiment, the simulation application 206 can provide a static timing analysis (STA), a voltage drop analysis, also referred to an IREM analysis, a Clock Domain Crossing Verification (CDC check), a formal verification, also referred to as model checking, equivalence checking, or any other suitable analysis. In a further exemplary embodiment, the simulation application 206 can perform an alternating current (AC) analysis, such as a linear small-signal frequency domain analysis, and/or a direct current (DC) analysis, such as a nonlinear quiescent point calculation or a sequence of nonlinear operating points calculated while sweeping a voltage, a current, and/or a parameter to perform the STA, the IREM analysis, or the other suitable analysis.

The verification application 208 verifies the one or more characteristics, parameters, or attributes of the electronic architectural design for the analog circuitry and/or the digital circuitry of the electronic device as replicated by the simulation application 206 satisfy the electronic design specification. The verification application 208 can also perform a physical verification, also referred to as a design rule check (DRC), to check whether the electronic architectural design for the analog circuitry and/or the digital circuitry of the electronic device satisfies one or more recommended parameters, referred to as design rules, as defined by a semiconductor foundry and/or semiconductor technology node for fabricating the electronic device.

Exemplary Fabrication of the Non-Planar Semiconductor Devices

FIG. 3A through FIG. 15C illustrate various views of partially-fabricated semiconductor structures where metal conductor rail structures formed in interlayer dielectric materials can be used to provide electrical connection to and/or between multiple conductive structures such as, for example, gate/source/drain terminals of finFET arrays according to exemplary embodiments of the present disclosure. The description of follow can be used to fabricate a non-planar semiconductor device, such as the finFET 100 as described above in FIG. 1A, and/or an integrated circuit having one or more non-planar semiconductor devices, such as the integrated circuit 129 as described above in FIG. 1D and/or the integrated circuit 150 as described above in FIG. 1E to provide some examples.

Figure 3A:
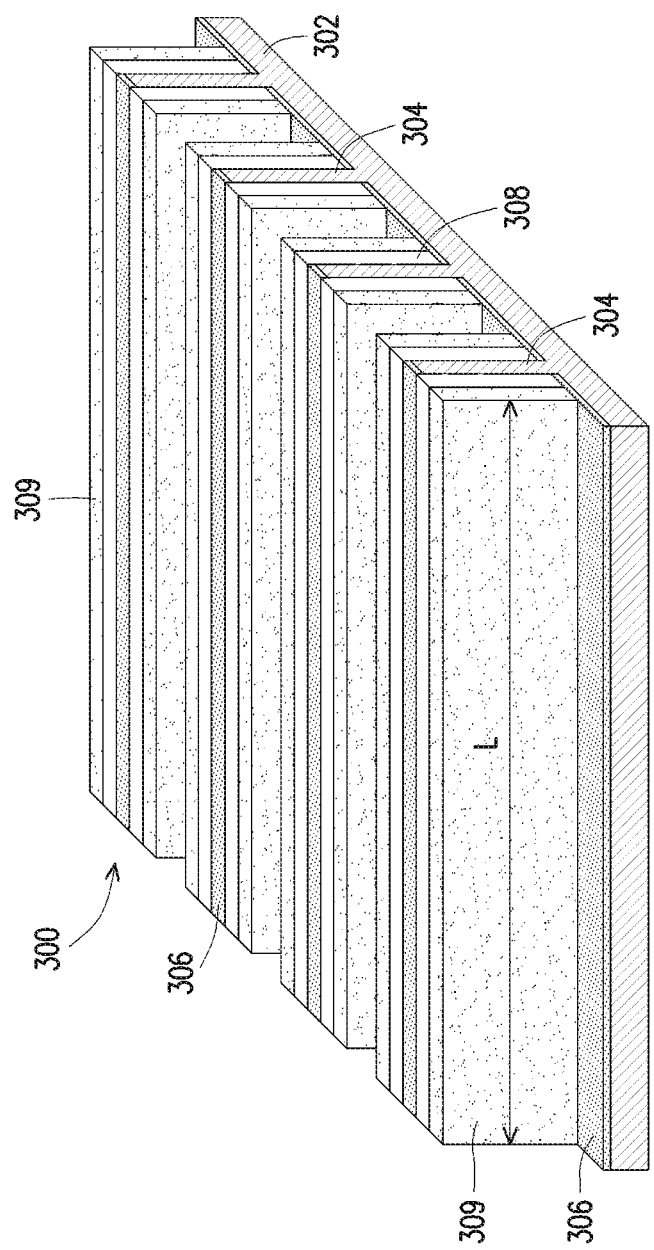
FIG. 3A through FIG. 12B illustrate various views of partially-fabricated semiconductor structures where metal conductor rail structures formed in interlayer dielectric materials can be used to provide electrical connection between multiple gate/source/drain terminals of finFET arrays according to exemplary embodiments of the present disclosure.

FIG. 3A is an isometric view of a partially-fabricated semiconductor structure according to an exemplary embodiment of the present disclosure. A partially-fabricated semiconductor structure 300 includes portions of finFETs. As illustrated in FIG. 3A, the partially-fabricated semiconductor structure 300 includes a semiconductor substrate 302, fin structures 304, hard masks 306, dielectric spacers 308, and the seed layer structures 309.

In the exemplary embodiment illustrated in FIG. 3A, the semiconductor substrate 302 can be a silicon substrate. However, the semiconductor substrate 302 can alternatively be (i) another semiconductor, such as germanium; (ii) a compound semiconductor including silicon carbide, gallium arsenide, gallium phosphide, indium phosphide, indium arsenide, gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), and/or indium antimonide; (iii) an alloy semiconductor including silicon germanium (SiGe); or (iv) combinations thereof. In an exemplary embodiment, semiconductor substrate 302 can be a semiconductor on insulator (SOI). In an exemplary embodiment, semiconductor substrate 302 can be an epitaxial material.

As illustrated in FIG. 3A, the fin structures 304 can include fin-shaped semiconductor material protruding from the substrate and can be in parallel (e.g., extending in the same direction) with each other. The fin structures 304 include active regions where one or more transistors are formed. The fin structures 304 can include: (i) silicon (Si) or another elementary semiconductor, such as germanium; (ii) a compound semiconductor including silicon carbide, gallium arsenide, gallium phosphide, indium phosphide, indium arsenide, GaAsP, AlInAs, AlGaAs, GaInAs, GaInP, GaInAsP and/or indium antimonide; (iii) an alloy semiconductor including SiGe; or (iv) combinations thereof. The fin structures 304 can be fabricated using suitable processes including patterning and etch processes. The patterning process can include forming a photoresist layer overlying the substrate (e.g., on a silicon layer), exposing the resist to a pattern, performing post-exposure bake processes, and developing the resist to form a masking element including the resist. The masking element can then be used to protect regions of the substrate while an etch process forms recesses into semiconductor substrate 302, leaving protruding fins. The recesses can be etched using a reactive ion etch (RIE) and/or other suitable processes. Numerous other methods to form the fin structures 304 on semiconductor substrate 302 may be suitable. For example, the fin structures 304 can include epitaxial material, in accordance with some embodiments.

The hard masks 306 can be used to pattern, such as by etching, the fin structures 304. The hard masks 306 can also be used protect the fin structures 304 during subsequent processing steps. In an exemplary embodiment, the hard masks 306 are formed on the top surfaces of the fin structures 304. The hard masks 306 can also be formed between the fin structures 304 and on top surfaces of semiconductor substrate 302. The hard masks 306 can made of a dielectric material, such as silicon nitride, silicon oxide, silicon carbide, silicon carbon nitride, silicon oxycarbide, titanium oxide, other suitable dielectric material, and/or combinations thereof. In an exemplary embodiment, the hard masks 306 is not formed on the top surface of semiconductor substrate 302.

As illustrated in FIG. 3A, the isolation spacers 308 can partially fill the recesses between the fin structures 304 and formed on the sidewalls of the fin structures 304. In an exemplary embodiment, the isolation spacers 308 can be made of a dielectric material such as, for example, silicon oxide, spin-on-glass, silicon nitride, silicon carbide, silicon carbon nitride, silicon oxynitride, silicon oxycarbide, fluorine-doped silicate glass (FSG), a low-k dielectric material, other suitable insulating material, and/or combinations thereof. In an exemplary embodiment, the isolation spacers 308 can be formed by blanket depositing an isolation material over the exposed surfaces and using an anisotropic etching process to remove horizontal portions of the deposited isolation layer. The isolation spacers 308 can be deposited by chemical vapor deposition (CVD), plasma-enhanced CVD (PECVD), physical vapor deposition (PVD), atomic layer deposition (ALD), other suitable processes, and/or combinations thereof. Other fabrication techniques for the isolation spacers 308 and/or the fin structures 304 are possible. The isolation spacers 308 can include a multi-layer structure such as, for example, a structure with one or more sub-spacers or dielectric liner layers. The isolation spacers 308 can also be formed by depositing an enhanced spacer layer using multi-step deposition and treatment process to eliminate voids and seams in the spacer material. In an exemplary embodiment, the isolation spacers 308 can be interlayer dielectric material. In an exemplary embodiment, the isolation spacers 308 are formed directly on hard masks 306 and on the sidewalls of the fin structures 304, as shown in FIG. 3A. In an exemplary embodiment, the isolation spacers 308 are formed directly on semiconductor substrate 302 and on the sidewalls of the fin structures 304.

As illustrated in FIG. 3A, seed layer materials 309 are formed on the sidewalls of isolation spacer 308. In an exemplary embodiment, seed layer materials 309 can be formed of silicon material such as, for example, silicon, silicon compounds, titanium nitride (TiN), tungsten, cobalt, other suitable materials, and/or combinations thereof In an exemplary embodiment, seed layer materials 309 can have a different etch selectivity than the isolation spacers 308. In an exemplary embodiment, seed layer materials 309 are formed directly on semiconductor substrate 302 and on the sidewalls of the isolation spacers 308. In an exemplary embodiment, seed layer materials 309 can be formed by blanket depositing a semiconductor material over the exposed surfaces, patterning the deposited semiconductor material, and using an anisotropic etching process to remove exposed portions of the deposited seed layer material not protected by photoresists. In some embodiments, a patterning and etching process forms seed layer materials 309 on sidewalls of fin 304 with uniform length L, as illustrated in FIG. 3A.

Figure 3B:
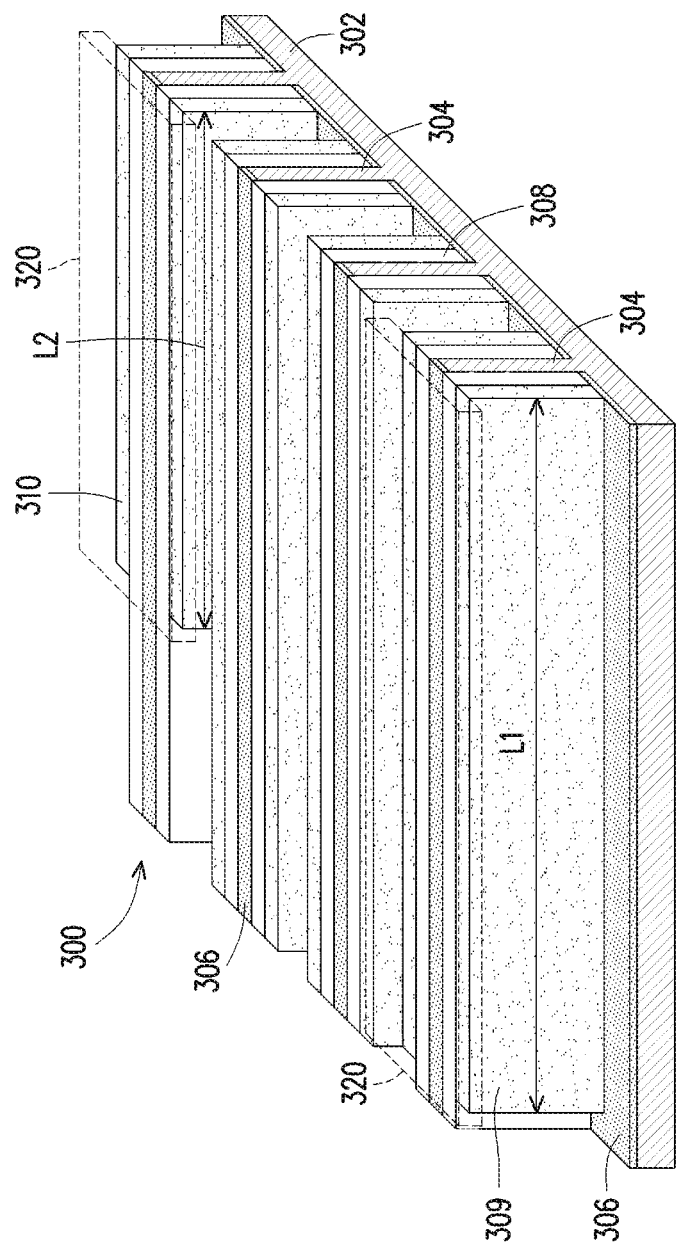

As illustrated in FIG. 3B, seed layer materials 309 are patterned and etched to form seed layer structures 310 using masking layer 320. An exemplary patterning process can include forming a photoresist layer over the exposed surfaces of deposited seed layer material, exposing the photoresist layer to a mask or reticle having a pattern thereon, performing a post-exposure bake process, and developing the resist to form a masking layer 320. In an exemplary embodiment, masking layer 320 can be hard masks such as, for example, silicon nitride layers, other suitable layers, and/or combinations thereof. Surface areas of seed layer material that are not protected by masking layer 320 are etched using, for example, a reactive ion etching (RIE) processes, a wet etching process, other suitable processes, and/or combinations thereof. In an exemplary embodiment, the etching selectivity can be substantially different between seed layer material and other structures of partially-fabricated semiconductor structure 300 by controlling etching parameters of the etch process such as, for example, etchant gas type, gas flow rate, etching temperature, plasma power, chamber pressure, other suitable parameters, and/or combinations thereof. For example, the etch process can be an RIE process using fluorocarbon gases such as $CF_4$, fluoroform ($CHF_3$), octafluoropropane ($C_3F_8$), other suitable etchant gases, and/or combinations thereof. The etch process can be an anisotropic etch process. Other fabrication techniques for the seed layer structures 310 are possible. The seed layer structures 310 can include a multi-layer structure such as, for example, a structure with one or more liner layers. In some embodiments, after the blanket deposition of seed layer material, seed layer structures 310 can be formed using a single patterning/etching process.

The length of seed layer structures 310, measured along the fin length, can vary based on device needs, for example, the length of subsequently formed metal drain channels. FIG. 3B illustrates seed layer structures 310 with different lengths such as, for example, lengths L1 and L2. As illustrated in FIG. 3B, top surfaces of hard masks 306, isolation spacers 308, and seed layer structures 310 can be substantially at the same level by performing suitable planarization processes on the top surfaces of these structures. The planarization process can be, for example, a chemical mechanical polishing (CMP) process.

Figure 3C:
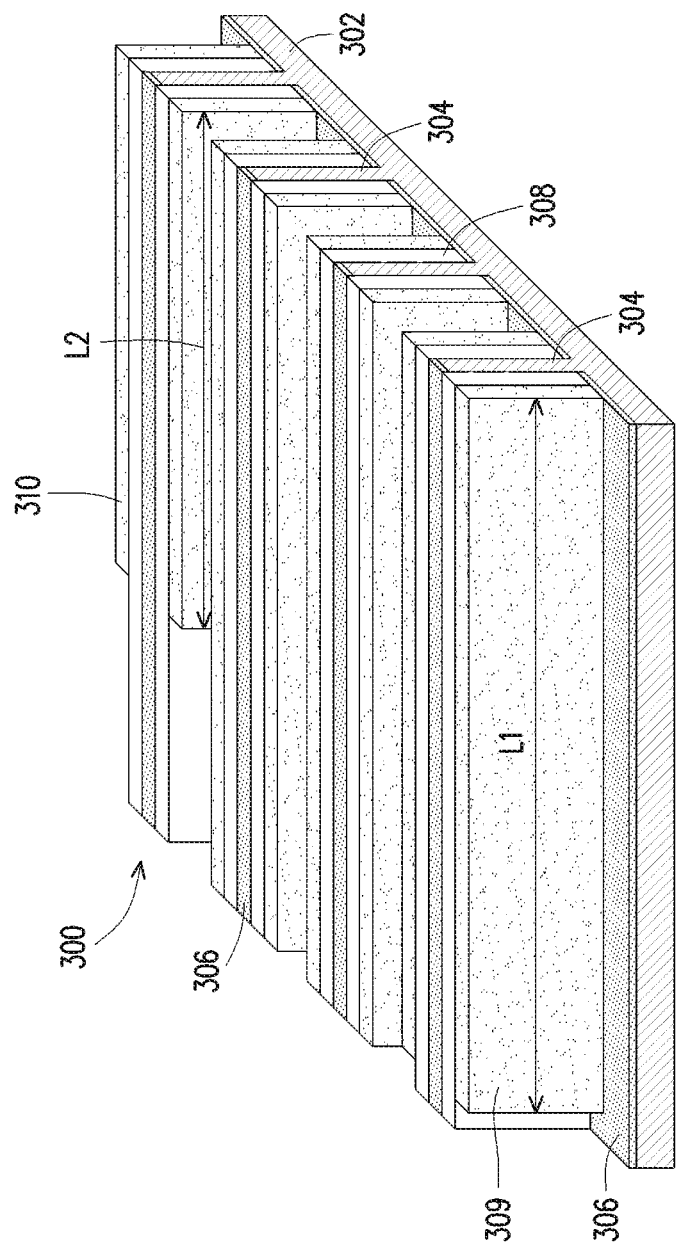

FIG. 3C illustrates partially-fabricated semiconductor structure 300 after a photoresist removal process. Photoresist 320 can be removed using any suitable processes such as, wet chemical process, dry etching process, and/or any combinations thereof. After the removal process, top surfaces of hard masks 306, isolation spacers 308, and seed layer structures 310 are exposed.

Figure 4:
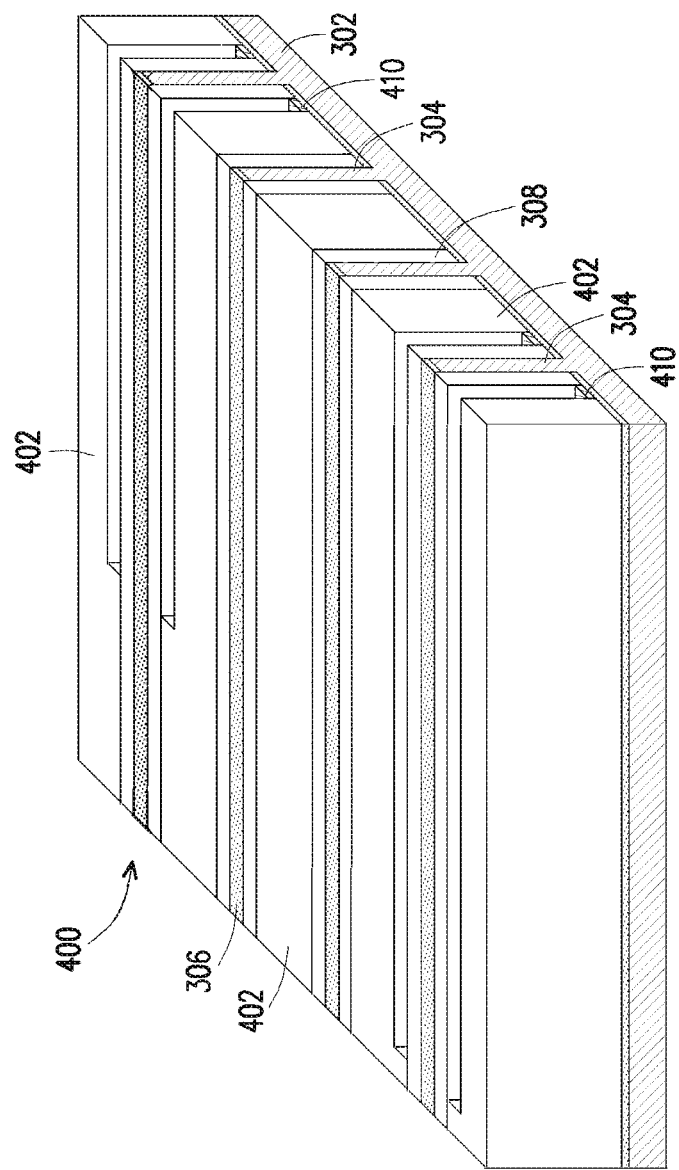

FIG. 4 is an isometric view of a partially-fabricated semiconductor structure after gap fill is formed in openings and seed layer structures are partially removed according to an exemplary embodiment of the present disclosure. Partially-fabricated semiconductor structure 400 includes the semiconductor substrate 302, the fin structures 304, the hard masks 306, the dielectric spacers 308, seed layer structures 410, and gap fill structures 402.

As illustrated in FIG. 4, the gap fill structures 402 can fill the openings in the partially-fabricated semiconductor structure 400 as described in FIG. 3A above. The gap fill structures 402 can fill the openings formed between any adjacent structures such as, for example, between adjacent fin structures 304, between opposing fin structures 304 and the seed layer structures 410, between opposing the seed layer structures 410, and/or other openings between structures. In an exemplary embodiment, the gap fill structures 402 can be made of a dielectric material similar to the isolation spacers 308, such as, for example, silicon oxide, spin-on-glass, silicon nitride, silicon carbide, silicon carbon nitride, silicon oxynitride, silicon oxycarbide, FSG, a low-k dielectric material, other suitable insulating material, and/or combinations thereof. In an exemplary embodiment, the gap fill structures 402 can be formed by blanket depositing a gap fill material over the exposed surfaces and in the openings and performing a planarization process to remove the excessive gap fill material that is formed over the top surfaces of the hard masks 306 and the seed layer structures 410 such that the top surfaces of partially-fabricated semiconductor structure 400 are substantially at the same level. Exemplary planarization processes can include CMP processes. The gap fill structures 402 can be deposited by CVD, PECVD, PVD, ALD, other suitable processes, and/or combinations thereof. Other fabrication techniques for the gap fill structures 402 are possible. The gap fill structures 402 can include a multi-layer structure such as, for example, a structure with one or more liner layers. The gap fill structures 402 can also be formed by depositing an enhanced gap fill layer using multi-step deposition and treatment process to eliminate voids and seams in the spacer material.

After the gap fill structures 402 are formed, the seed layer structures 310 are etched back to form the seed layer structures 410. The seed layer structures 310 can be etched by any suitable etching processes for example, an RIE processes, a wet etching process, other suitable processes, and/or combinations thereof. In an exemplary embodiment, the etching process can be an anisotropic etching process. In an exemplary embodiment, the etching selectivity can be substantially different between seed layer material and other structures of the partially-fabricated semiconductor structure 400 by controlling etching parameters of the etch process. The etching process can continue until a nominal thickness of the partially-fabricated semiconductor structure 400 is reached. In an exemplary embodiment, the thickness of the seed layer structures 410 can be in a range of between about 5 Å to about 15 Å (e.g., 5 Å to 15 Å). In an exemplary embodiment, the seed layer structures 410 can have a thickness of about 10 Å. The thickness of the seed layer structures 410 can be determined by a few factors, including but not limited to, the thickness uniformity and impact on conductivity. For example, a reduced seed layer thickness may impact the uniformity of the seed layer thickness, while a greater thickness may impact the overall conductivity of the subsequently formed metal rail conductors.

Figure 5A:
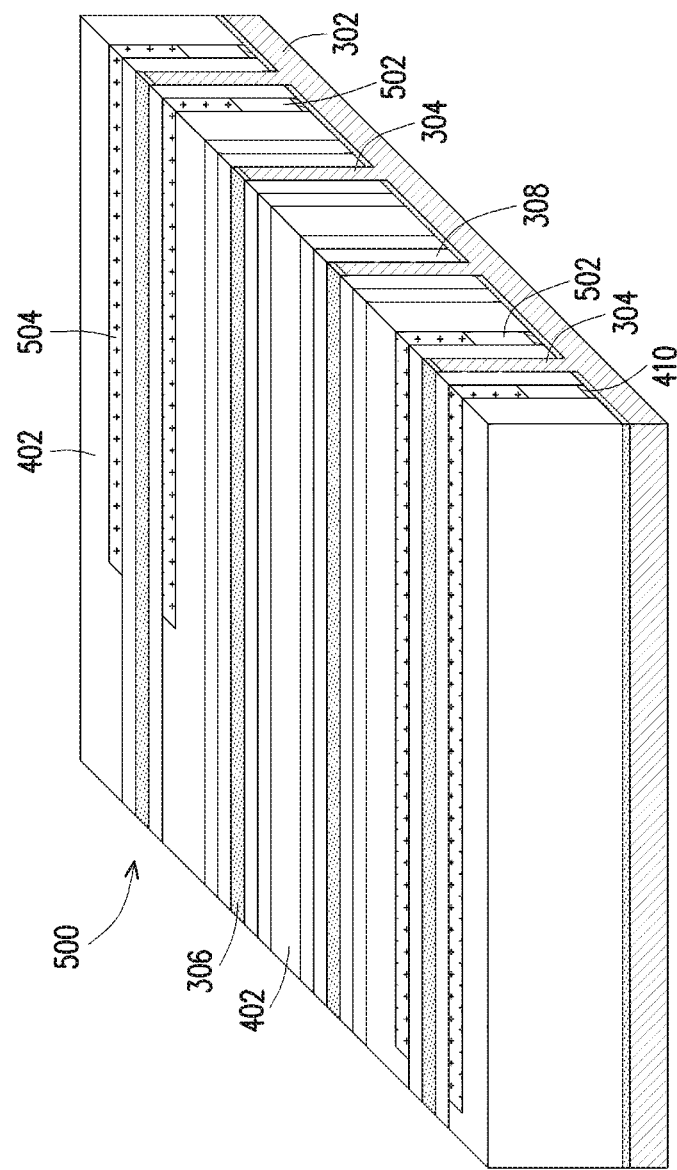
Figure 5B:
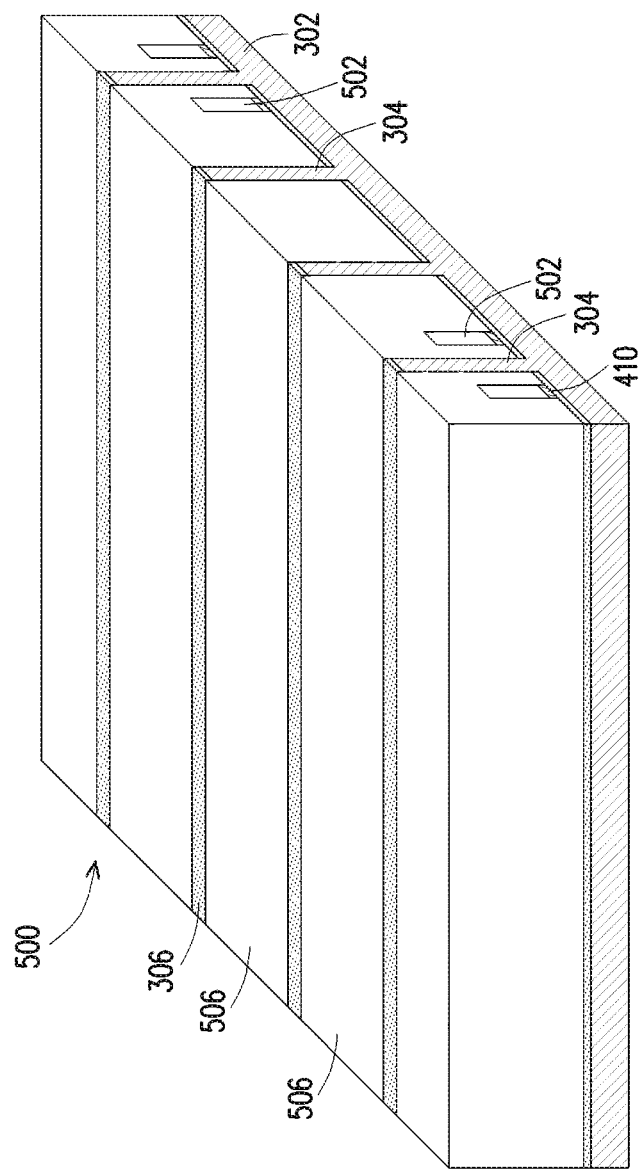

FIG. 5A-5B are isometric views of a partially-fabricated semiconductor structure after metal rail conductors and interlayer dielectric fills are formed according to an exemplary embodiment of the present disclosure. As illustrated in FIG. 5A, partially-fabricated semiconductor structure 500 includes the semiconductor substrate 302, the fin structures 304, the hard masks 306, the dielectric spacers 308, the gap fill structures 402, the seed layer structures 410, metal rail conductors 502, and dielectric fill 504. In an exemplary embodiment, the dielectric spacers 308, the gap fill structures 402, and the dielectric fill 504 can be formed of the same material. For simplicity purposes they are combined and illustrated as an interlayer dielectric (ILD) 506 as illustrated in FIG. 5B.

As illustrated in FIG. 5A, the metal rail conductors 502 can be formed on the seed layer structures 410. In an exemplary embodiment, the metal rail conductors 502 can be formed of any suitable materials such as tungsten, cobalt, copper, aluminum, other suitable materials, and/or combinations thereof. In an exemplary embodiment, the metal rail conductors 502 can be formed using metal alloys of the above listed material. The top surface of the metal rail conductors 502 can be a substantially smooth surface. The metal rail conductors 502 can be formed using the seed layer structures 410 as a seed layer where the growth of the metal rail conductors 502 is started. For example, the metal rail conductors 502 can start forming from the top surface of the seed layer structures 410 until a nominal thickness of the metal rail conductor is achieved. In an exemplary embodiment, the growth of metal rail conductor material can be completed using suitable processes such as CVD, electroplating, electroless plating, other suitable processes, and/or combinations thereof. For example, tungsten material can be formed using silicon material as a seed layer. The height of the metal rail conductors 502 can be in a range between about 0.8 to about 1.2 times the gate pitch of the finFET devices. In an exemplary embodiment, the width of metal rail conductors can be in a range between about 0.8 to about 2.2 times the width of the fin structures 304. In an exemplary embodiment, the pitch of metal rail conductors (i.e., the distance between centers of adjacent metal rail conductors) can be in a range between about 0.8 to about 1.2 times the fin pitch of the fin structures 304. In an exemplary embodiment, each the metal rail conductors 502 can have substantially similar widths or heights. In an exemplary embodiment, the widths or heights can be different between each of the metal rail conductors 502.

After the metal rail conductors 502 are formed, the dielectric fills 504 are formed over the metal rail conductors 502 and filling the openings within the gap fill structures 402. In an exemplary embodiment, the dielectric fills 504 can be formed by performing a blanket deposition of dielectric fill material on the structure until the openings within the gap fill structures 402 are completely filled. A planarization process is subsequently performed to remove the excessive dielectric fill material and planarize the dielectric fill material until the top surfaces of the dielectric fill material are substantially at the same level with the hard masks 306. After the planarization process, the planarized dielectric fill material forms the dielectric fills 504. In an exemplary embodiment, the dielectric fills 504 can be formed using the same material as dielectric spacers 308 and the gap fill structures 402. For example, the dielectric fills 504 can be formed using silicon oxide, spin-on-glass, silicon nitride, silicon carbide, silicon carbon nitride, silicon oxynitride, FSG, a low-k dielectric material, other suitable insulating material, and/or combinations thereof. In some situations, the dielectric spacers 308, the gap fill structures 402, and the dielectric fills 504 can be formed using the same material as illustrated as the ILD 506 in FIG. 5B for simplicity. Subsequent fabrication steps will be based upon the structure shown in FIG. 5B.

Figure 6:
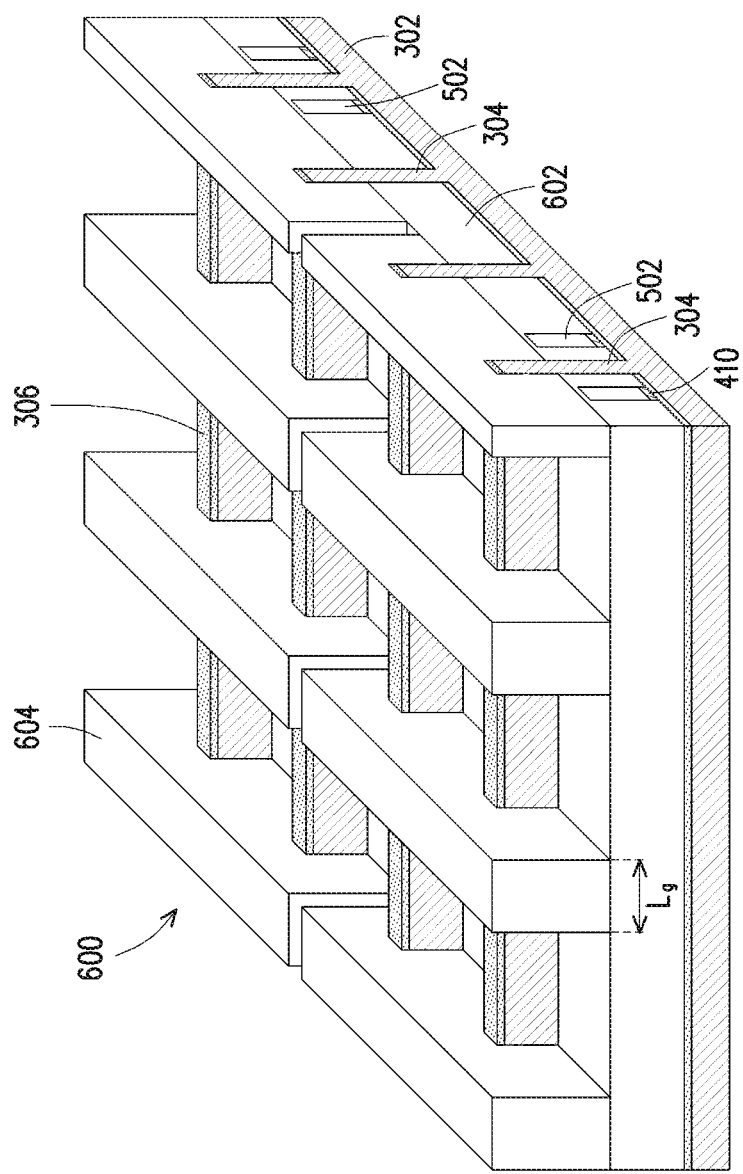

FIG. 6 is an isometric view of a partially-fabricated semiconductor structure after etching back the ILD layer and forming poly gates over the fins according to an exemplary embodiment of the present disclosure. Partially-fabricated semiconductor structure 600 includes the semiconductor substrate 302, the fin structures 304, the hard masks 306, the seed layer structures 410, the metal rail conductors 502, partially-etched ILD 602, and poly gate structures 604.

In the exemplary embodiment illustrated in FIG. 6, the ILD 506 from partially-fabricated semiconductor structure 500 of FIG. 5B is uniformly etched until a nominal depth is achieved. The etching process can be an isotropic etching process where the etched thickness of the ILD 506 is uniform across the semiconductor structure. The ILD 506 forms partially-etched ILD 602 after the etching process. After the etching process, portions of the fin structures 304 can protrude from the top surfaces of the partially-etched ILD 602. The amount of the ILD 506 removed can depend upon a few factors. First, the protruding portions of the fin structures 304 are used to form the active portions of finFET devices in subsequent fabrication steps. For example, the protruding portions of the fin structures 304 represent active portions of the fin that are used to form the channel and source/drain regions of the finFET devices. Therefore, a sufficient height for the fin structures 304 can be above the top surfaces of partially-etched ILD 602. Second, the metal rail conductors 502 should remain under partially-etched ILD 602 after the etching process without being exposed.

After the partially-etched ILD 602 is formed, the poly gate structures 604 can be formed on the exposed surfaces of the fin structures 304 including top surfaces and sidewall surfaces not covered by the partially-etched ILD 602. In an exemplary embodiment, portions of the hard masks 306 can be patterned and removed before depositing the poly gate material such that the poly gate structures 604 can form directly on the top surfaces of the fin structures 304. In an exemplary embodiment, removing the hard mask layer includes performing a wet chemical process with phosphoric acid ($H_3PO_4$) that etches silicon nitride. The poly gate structures 604 can be formed by blanket depositing a semiconductor material and performing patterning and etching processes. The poly gate structures 604 can include a gate dielectric layer, a gate electrode structure, and/or one or more additional layers, according to some embodiments. In an exemplary embodiment, the poly gate structures 604 use polysilicon as the gate electrode structures. In an exemplary embodiment, the poly gate structures 604 use amorphous silicon as the gate electrode structure. In an exemplary embodiment, the poly gate structures 604 can be sacrificial gate structures such as formed in a gate replacement process used to form metal gate structures. In an exemplary embodiment, a hard mask (not shown in FIG. 6) is disposed on a top surface of the poly gate structures 604. The hard mask can be used to pattern, such as by etching, semiconductor material to form the poly gate structures 604. In an exemplary embodiment, the hard mask can be made of a dielectric material, such as silicon nitride. In an exemplary embodiment, the poly gate pitch (i.e., the distance between centers of adjacent poly gate structures 604) can be in a range between about 10 nm to about 300 nm. In an exemplary embodiment, the poly gate length $L_g$ can be in a range between about 3 nm to about 80 nm.

Figure 7A:
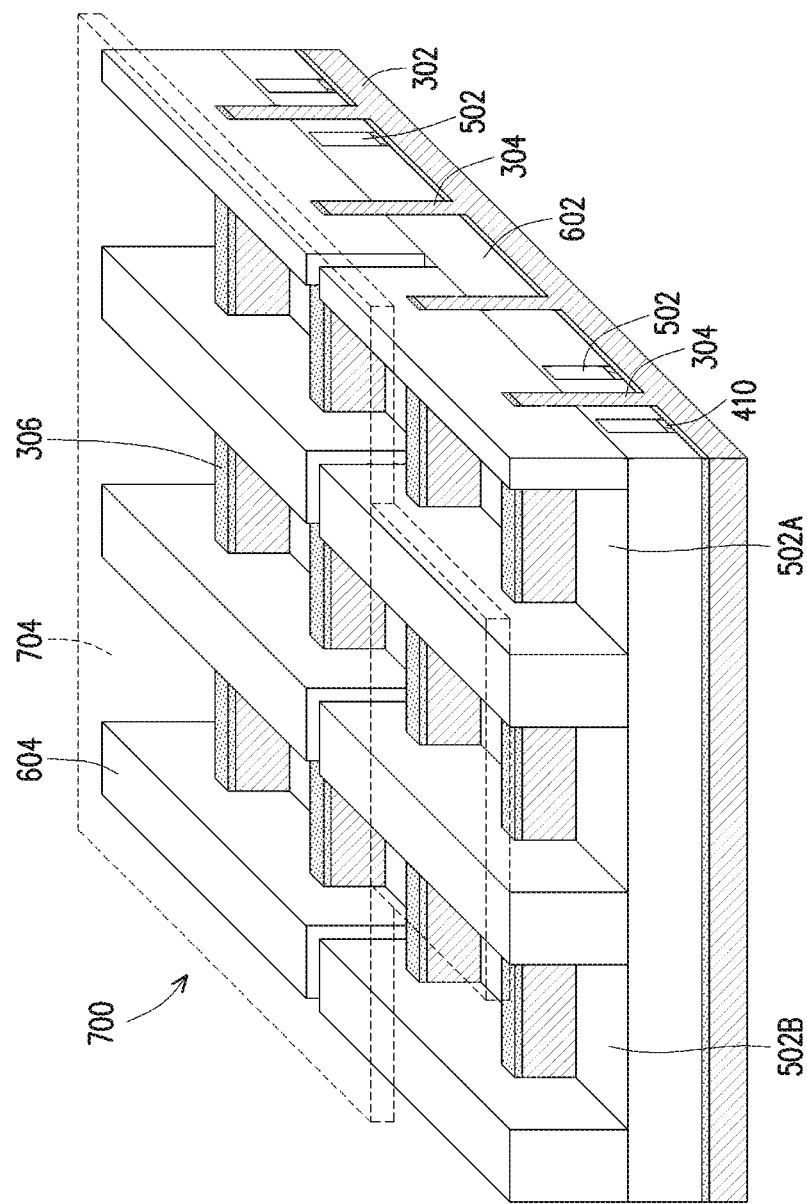
Figure 7B:
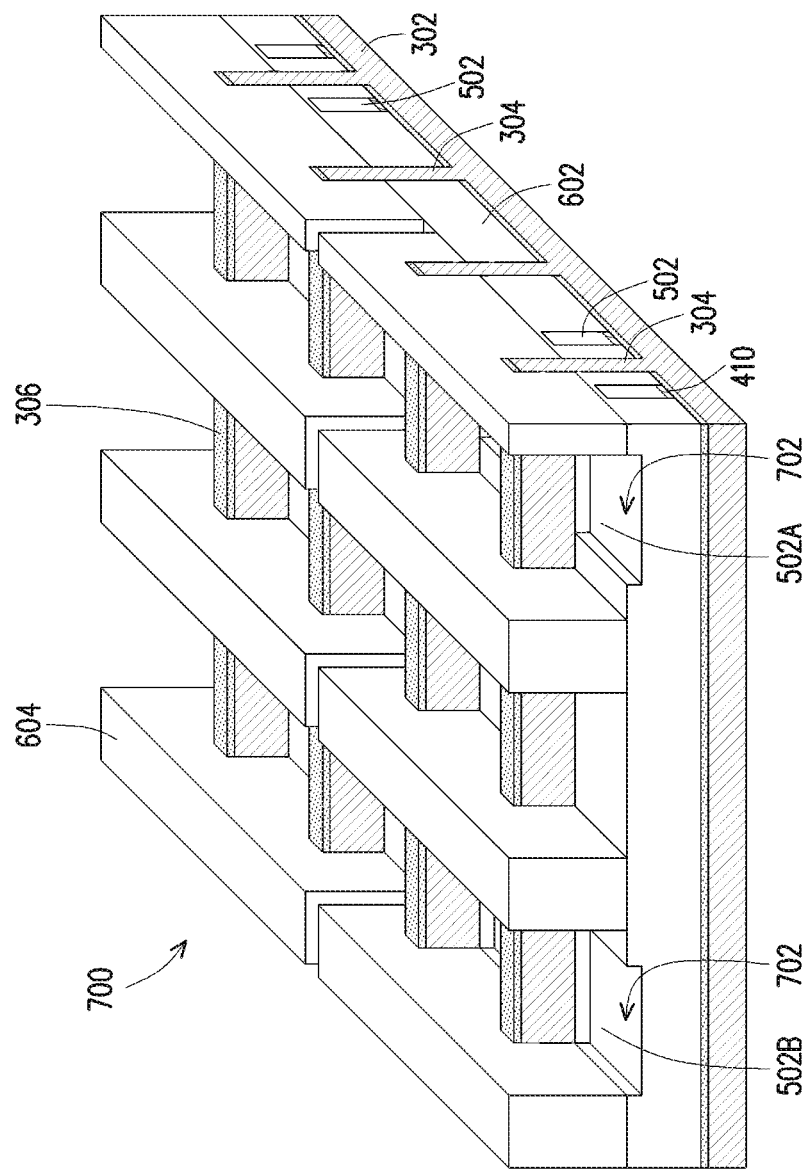

FIG. 7A and FIG. 7B are an isometric views of a partially-fabricated semiconductor structure for opening a trench in the partially-etched ILD to expose portions of metal rail conductors, according to an exemplary embodiment of the present disclosure. Partially-fabricated semiconductor structure 700 includes the semiconductor substrate 302, the fin structures 304, the hard masks 306, the seed layer structures 410, the metal rail conductors 502, the partially-etched ILD 602, the poly gate structures 604, and trenches 702 formed in the partially-etched ILD 602.

One or more patterning and etching processes can be used to expose portions of metal rail conductors. For example, as illustrated in FIG. 7A, the patterning process can include forming a photoresist layer overlying the structure (e.g., on the poly gate structures), exposing the resist to a pattern, performing post-exposure bake processes, and developing the resist to form a masking layer 704. Due to the small feature size and pitch between adjacent poly gate structures 604, the patterned masking layer can have sufficient mechanical strength to suspend between adjacent poly gate structures or hang as a ledge over the edge of a poly gate structure.

Figure 8:
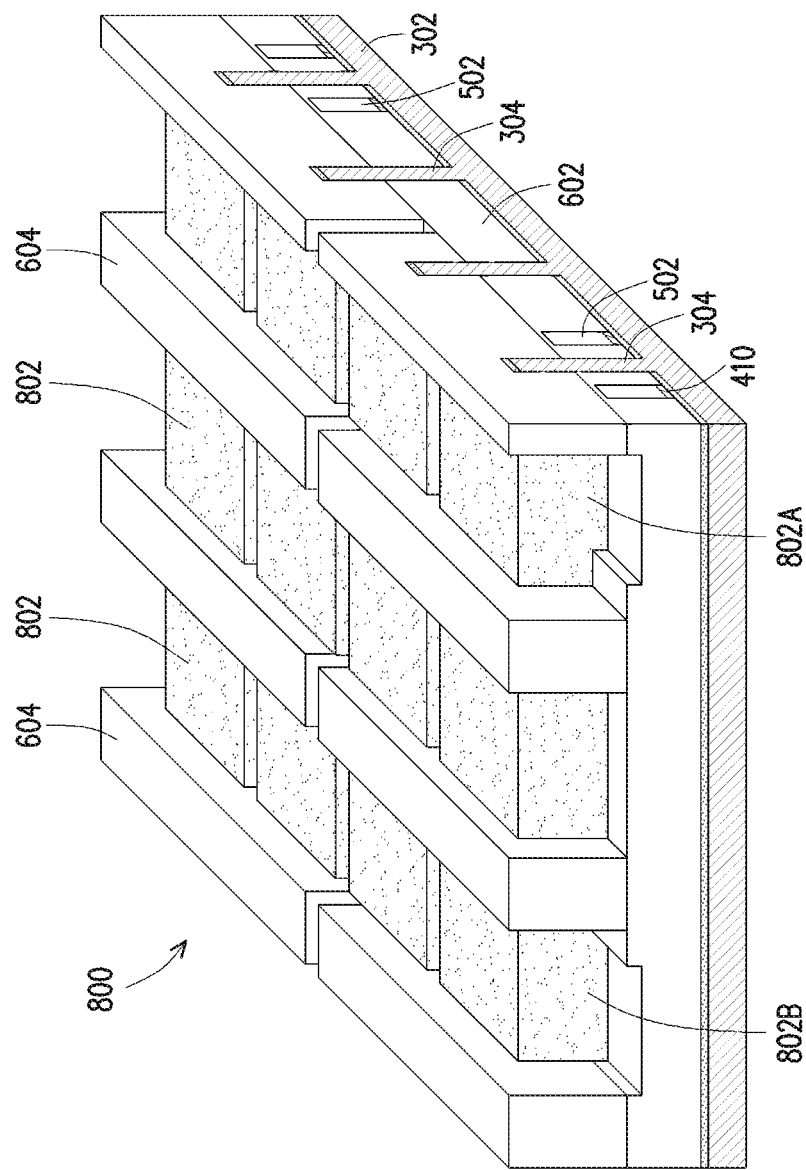

FIG. 7B illustrates partially-fabricated semiconductor structure after an etching process to expose portions of metal rail conductors and a removal process to remove the masking layer. After patterned masking layer 704 is formed, one or more etching processes can be performed to remove the exposed partially-etched ILD 602 and expose the selected underlying the metal rail conductors 502. In the exemplary embodiment illustrated in FIG. 7B, the trenches 702 are formed between adjacent poly gate structures 604 and in the partially-etched ILD 602. The trenches 702 are used to expose portions of one or more of the metal rail conductors 502 that are formed between adjacent poly gate structures 604 such that subsequent structures (e.g., conductive structures such as, for example, source/drain contacts and/or gate contacts) can form direct electrical contact with the metal rail conductors 502. The specific the metal rail conductors 502 to be exposed depend on circuit designs and can be one or more of the metal rail conductors 502. The fabrication process to expose selected the metal rail conductors 502 can include patterning and removing portions of the partially-etched ILD 602 that are formed over the selected metal rail conductors 502. In an exemplary embodiment, an entire area of the partially-etched ILD 602 that is surrounded by opposing adjacent fin structures 304 and opposing adjacent poly gate structures 604 is etched to expose the underlying metal rail conductors 502. Exposing the entire area described above maximizes contact area to the metal rail conductors 502 and thus provides the benefit of minimizing contact resistance to the metal rail conductors 502. In an exemplary embodiment, only portions of the area are exposed. For example, metal rail conductor regions 502A and 502B of the metal rail conductors 502 are exposed as illustrated in FIG. 7B. Patterning and exposing a portion of the area provides the benefit of a greater tolerance to lithography alignment as it reduces the possibility of exposing unwanted adjacent areas of the partially-etched ILD 602 in case a misalignment occurs. In an exemplary embodiment, the area exposed depends on the circuit and device needs and considerations. FIG. 8 is an isometric view of a partially-fabricated semiconductor structure after source/drain terminals are formed according to an exemplary embodiment of the present disclosure. Partially-fabricated semiconductor structure 800 includes the semiconductor substrate 302, the fin structures 304, the seed layer structures 410, the metal rail conductors 502, the partially-etched ILD 602, the poly gate structures 604, and epitaxial source/drain terminals 802.

In the exemplary embodiment illustrated in FIG. 8, each finFET includes a pair of source/drain terminals. The source and drain terminals are interchangeable and are formed in, on, and/or surrounding the fin structures 304. A source or drain terminal is formed on one side of a poly gate structure. In an exemplary embodiment, adjacent finFET devices share a common source/drain terminal. Channel regions of the fin structures 304 underlie the respective the poly gate structures 604. One or more epitaxial source/drain terminals 802 directly contact and are electrically connected to the exposed metal rail conductors. For example, epitaxial source/drain terminals 802A and 802B of epitaxial source/drain terminals 802 respectively connects to metal rail conductor regions 502A and 502B. Although only epitaxial source/drain terminals 802A and 802B are shown to be connected in FIG. 8, other source/drain terminals can also be connected depending on the design and device needs. Because the metal rail conductors are formed within the partially-etched ILD 602, they can electrically connect multiple source/drain terminals without occupying additional device space.

As illustrated in FIG. 8, the epitaxial source/drain terminals 802 can be formed on active fin structures of the fin structures 304 that are protruding from the top surface of the partially-etched ILD 602. In an exemplary embodiment, the epitaxial source/drain terminals 802 can be epitaxial source/drains terminals that are formed by growing epitaxial layers over exposed surfaces of fin 304. In an exemplary embodiment, the hard masks 306 are removed from the top of the fin structures 304 prior to the formation of the epitaxial source/drain terminals 802. In an exemplary embodiment, the fin structures 304 are formed using epitaxial material such as epitaxial silicon, epitaxial silicon germanium (SiGe), gallium arsenide, other suitable materials, and/or combinations thereof. Growing the epitaxy layers on exposed surfaces of the fin structures 304 can include performing a pre-clean process to remove the native oxide on the surface of the fin structures 304. Next, an epitaxy process is performed to grow the epitaxy layers on the exposed surfaces of the fin structures 304. In an exemplary embodiment, the epitaxy process is an SiGe epitaxy process performed at a temperature between about 400° C. and about 500° C. (e.g., between 400° C. and 500° C.). The epitaxy process is a selective process that only grows the epitaxy layer on the exposed surfaces of the active fin structures. The epitaxy process can use the exposed surfaces of the fin structures 304 as seed layers and the growth process continues until a nominal size and/or structure of source/drain terminals has been reached. An in-situ doping process can also be performed during the epitaxy process. In an exemplary embodiment, epitaxial source/drain terminal 802 is a SiGe structure. In an exemplary embodiment, the epitaxial source/drain terminals 802 can be a silicon structure. In an exemplary embodiment, the thickness of the epitaxial source/drain terminals 802 is between about 10 nm and about 20 nm (e.g., between 10 nm and 20 nm). In an exemplary embodiment, the epitaxial source/drain terminals 802 are doped with p-type or n-type dopants during the epitaxy process. For example, the epitaxial source/drain terminals 802 can be doped with boron (B) during the epitaxy process. The epitaxial source/drain terminals 802 can also take different shapes depending on various factors such as, for example, the epitaxy process condition, the crystalline orientation of active fin structures, and/or other suitable factors. In an exemplary embodiment, the shape of the epitaxial source/drain terminals 802 using epitaxial material have a substantially diamond-shaped cross section. In an exemplary embodiment, top surfaces of the epitaxial source/drain terminals 802 can be recessed below top surfaces of the poly gate structures 604 as illustrated in FIG. 8. In an exemplary embodiment, the top surfaces of the epitaxial source/drain terminals 802 are substantially at the same level as the top surfaces of the poly gate structures 604.

Figure 9:
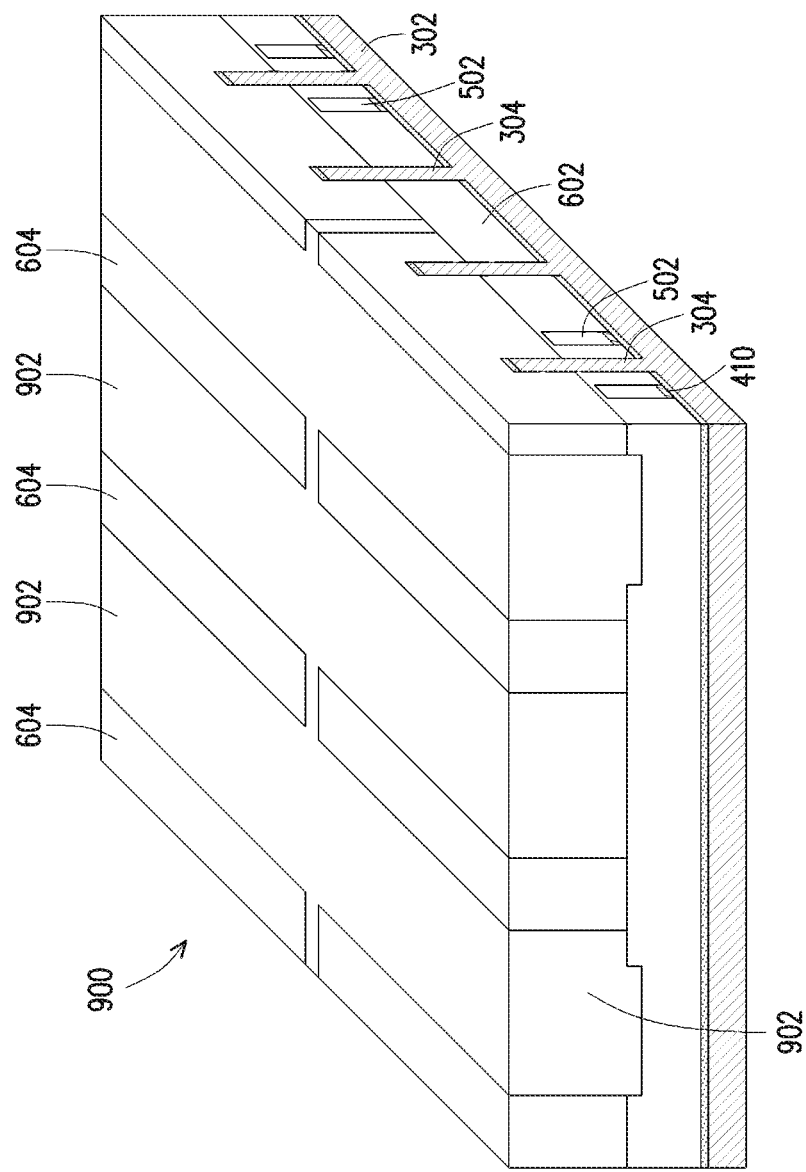

FIG. 9 is an isometric view of a partially-fabricated semiconductor structure after shallow trench isolation structures are formed according to an exemplary embodiment of the present disclosure. Partially-fabricated semiconductor structure 900 includes the semiconductor substrate 302, the fin structures 304, the seed layer structures 410, the metal rail conductors 502, the partially-etched ILD 602, the poly gate structures 604, and shallow trench isolation (STI) structures 902.

As illustrated in FIG. 9, the STI structures 902 can be deposited in openings of the partially-fabricated semiconductor structure 800 described above with reference to FIG. 8. The STI structures 902 can be used to provide electrical isolation and mechanical support for subsequently formed structures. The STI structures 902 can be formed using dielectric material such as, for example, silicon oxide, spin-on-glass, silicon nitride, silicon oxynitride, FSG, a low-k dielectric material, other suitable insulating material, and/or combinations thereof. The STI structures 902 can be formed by depositing insulating dielectric material to fill the openings followed by a planarization process (e.g., a CAP process). The STI structures 902 can be deposited by CVD, PECVD, PVD, ALD, other suitable processes, and/or combinations thereof. Other fabrication techniques for the STI structures 902 are possible. The STI structures 902 can include a multi-layer structure such as, for example, a structure with one or more liner layers. The STI structures 902 can also be formed by depositing an enhanced gap fill layer using the multi-step deposition and treatment process to eliminate voids and seams in the dielectric material. After the planarization process, the top surfaces of the poly gate structures 604 and the STI structures 902 are substantially at the same level.

Figure 10:
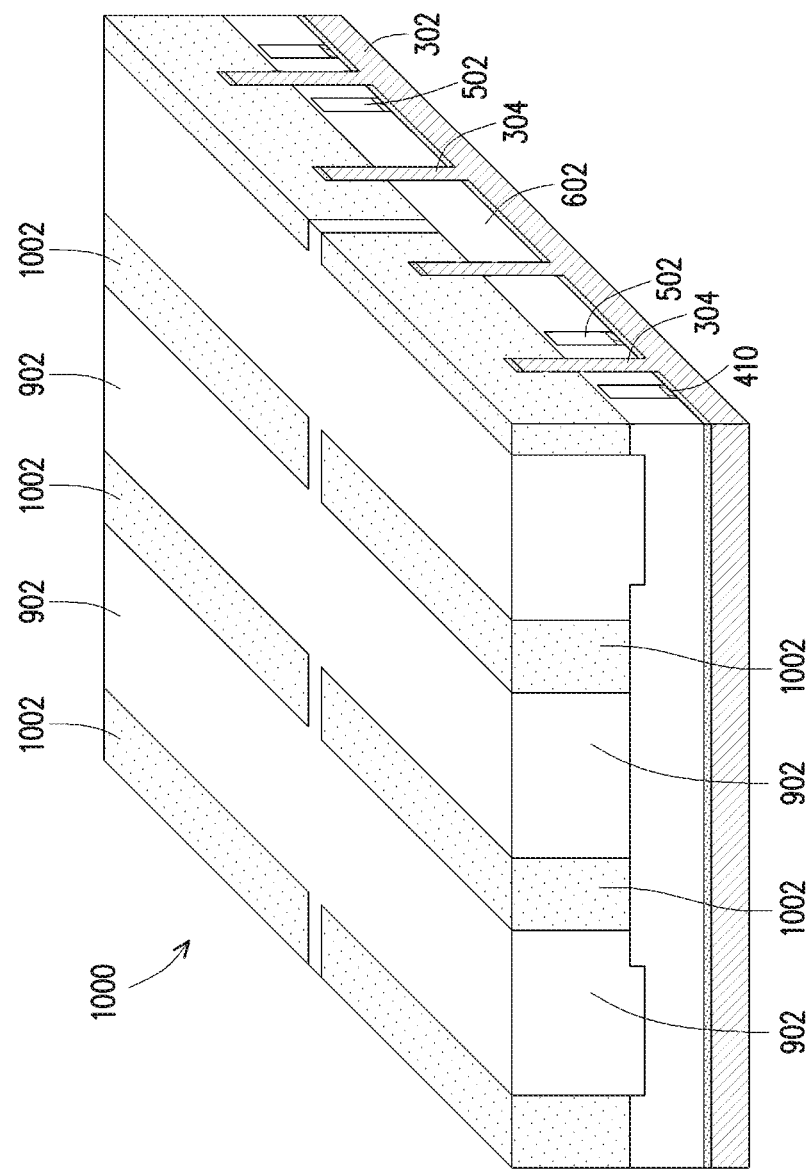

FIG. 10 is an isometric view of a partially-fabricated semiconductor structure after a gate replacement process according to an exemplary embodiment of the present disclosure. Partially-fabricated semiconductor structure 1000 includes the semiconductor substrate 302, the fin structures 304, the seed layer structures 410, the metal rail conductors 502, the partially-etched ILD 602, the STI structures 902, and metal gate structures 1002.

As described above with reference to FIG. 6, although the poly gate structures 604 are described as using polysilicon or amorphous silicon, the poly gate structures 604 can be sacrificial gate structures such as formed in a replacement gate process used to form metal gate structures. For example, the poly gate structures 604 can be replaced by a metal gate structures 1002 as illustrated in FIG. 10. The metal gate structures 1002 can further include barrier layer(s), gate dielectric layer(s), work function layer(s), fill metal layer(s), and/or other suitable materials for metal gate structures. In an exemplary embodiment, the metal gate structures 1002 can include capping layers, etch stop layers, and/or other suitable materials. The gate replacement process can be a self-aligned gate replacement process where no alignment is needed. For example, the gate replacement process can begin by removing the poly gate structures 604 through an etching process such as, for example, a dry etching process, a wet etching process, other suitable processes, and/or combinations thereof. The removal of the poly gate structures 604 leaves openings in the partially-fabricated semiconductor structure 1000. Conductive material used to form the metal gate structures 1002 can be then blanket deposited over the openings. A subsequent planarization process can then be used such that the top surfaces of STI structures 902 and the metal gate structures 1002 are substantially at the same level. After the planarization process, the deposited metal gate material forms the metal gate structures 1002. Because the deposited metal gate material forms in the openings without the need of alignment, the gate replacement process is a self-aligned process.

Figure 11A:
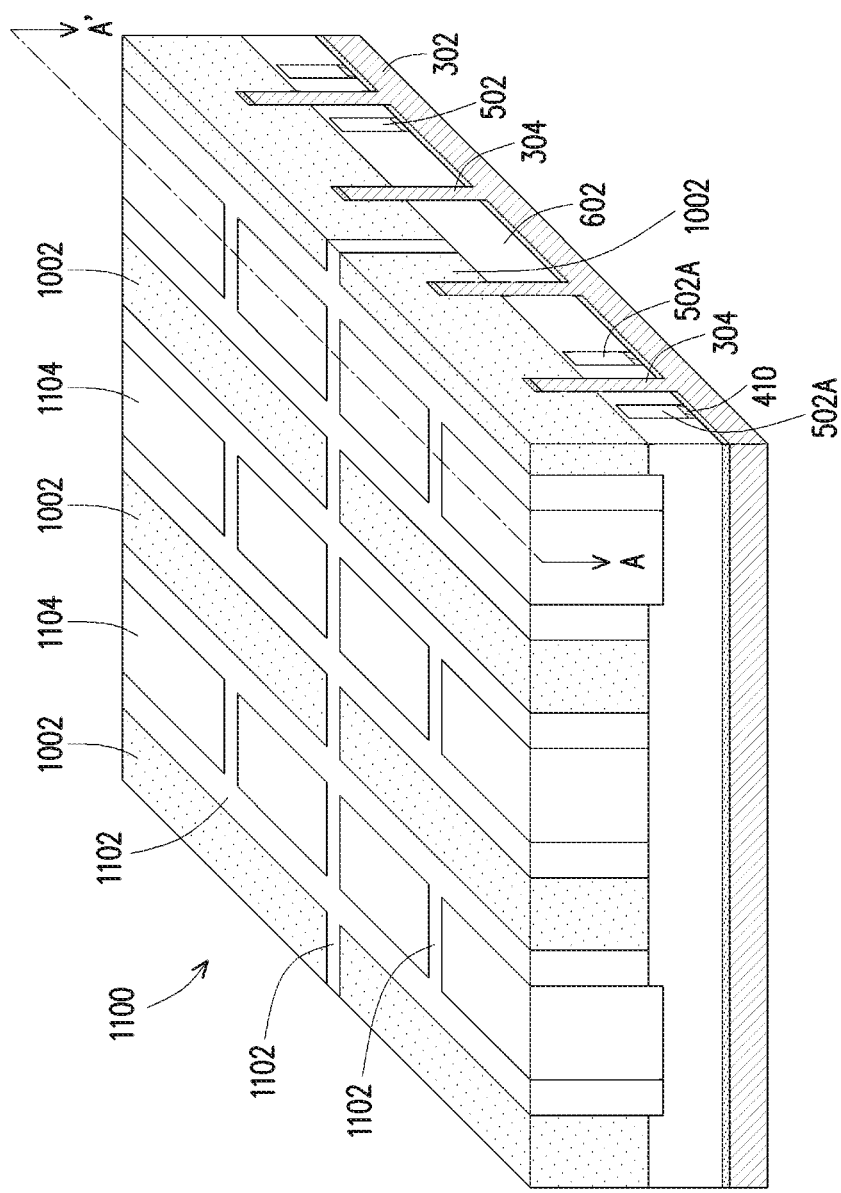
Figure 11B:
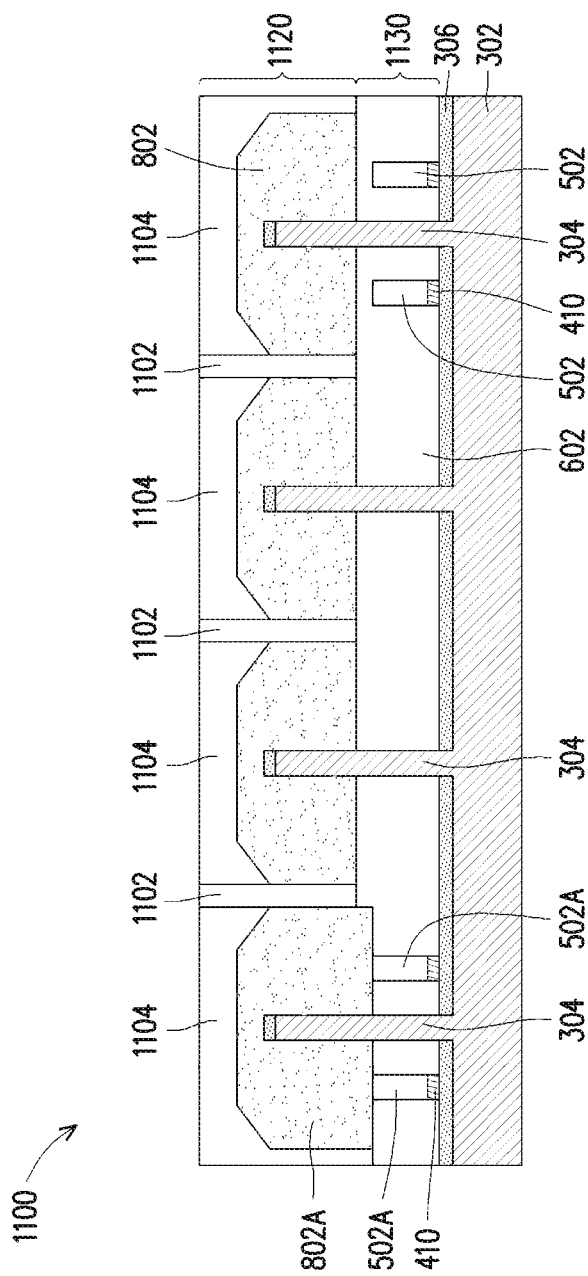

FIG. 11A is an isometric view of a partially-fabricated semiconductor structure after forming metal source/drain contacts according to an exemplary embodiment of the present disclosure. Partially-fabricated semiconductor structure 1100 includes the semiconductor substrate 302, the fin structures 304, the seed layer structures 410, the metal rail conductors 502, the partially-etched ILD 602, the metal gate structures 1002, etched STI structures 1102, and source/drain contacts 1104. FIG. 11B is a cross-sectional view of partially-fabricated semiconductor structure 1100 along the A-A' line illustrated in FIG. 11A. The discussion below of elements of partially-fabricated semiconductor structure 1100 in FIG. 11A applies to elements in FIG. 11B with the same annotations unless mentioned otherwise. It will be recognized that the views of partially-fabricated semiconductor structure 1100 are shown for illustration purposes and may not be drawn to scale. As illustrated in FIGS. 11A-11B, epitaxial source/drain terminal 802A is electrically connected to metal rail conductors 502A.

In the exemplary embodiment illustrated in FIGS. 11A-11B, the source/drain contacts 1104 can be metallic contacts that are formed directly on the epitaxial source/drain terminals 802 and used to provide electrical connection to the epitaxial source/drain terminals 802. In some embodiments, source/drain contacts 1104 can be formed in on the epitaxial source/drain terminals 802A and in physical contact with metal rail conductors 502A. In such scenarios, source/drain terminals 802A can be etched to expose a portion of underlying metal rail conductors 502A, and source/drain contacts 1104 can be deposited on and in contact with metal rail conductors 502A. In addition, various of conductive structures can be formed in partially-fabricated semiconductor structure 1100, such as vias and transistor devices. In some embodiments, vias can be formed on metal rail conductors 502A by etching through source/drain terminals 802 or 802A. In some embodiments, vias can be formed by forming openings in partially-etched ILD 602, exposing underlying metal rail conductors 502 or 502A, and depositing conductive material in the openings to form vias. The vias can provide electrical connections between metal rail conductors 502 or 502A and other components of partially-fabricated semiconductor structure 1100. As shown in FIG. 11B, the protruding portions of the fin structures 304 represent active fin portions 1120 of the fin that are used to form the channel and source/drain regions of the finFET devices. The portions of the fin structures 304 buried in partially-etched ILD 602 represent non-active fin portions 1130 of the fin. Source/drain contacts 1104 can be formed on active fin regions 1120 of fin structures 304 and above non-active fin regions 1130. Patterning and etching processes can be used to form openings in the STI structures 902 for the deposition of source/drain contact material. In an exemplary embodiment, STI material can be removed from between opposing the metal gate structures 1002 to expose underlying the epitaxial source/drain terminals 802. In an exemplary embodiment, this STI material can remain between adjacent fin structures 304 to provide electrical isolation. The etched STI structures 1102 are formed by patterning and etching the STI material to expose the underlying the epitaxial source/drain terminals 802. In an exemplary embodiment, the source/drain contacts 1104 are formed by a blanket deposition using an ALD process, a CVD process, a PVD process, or a combination thereof. In an exemplary embodiment, the source/drain contacts 1104 can be made of metal such as, for example, cobalt (Co), tungsten (W), copper (Cu), nickel (Ni), ruthenium (Ru), or other suitable materials. In an exemplary embodiment, a planarization process (e.g., a CAP process) is performed to remove excessive source/drain contact material of the source/drain contacts 1104 that are formed over the top surfaces of the STI structures 902 and the metal gate structures 1002. The source/drain contacts 1104 can be formed after the planarization process, and the top surfaces of the source/drain contacts 1104, the etched STI structures 1102, and the metal gate structures 1002 are substantially at the same level. In an exemplary embodiment, the source/drain contacts 1104 can further include a barrier layer formed between the source/drain contacts and STI structures 1102 to avoid diffusion of materials from the source/drain contacts 1104 into the etched STI structures 1102.

In an exemplary embodiment, forming the source/drain contacts 1104 can further include forming a silicide layer between the source/drain contacts 1104 and the epitaxial source/drain terminals 802. In an exemplary embodiment, an etch process is performed to recess the top surfaces of the epitaxial source/drain terminals 802 to form a flat surface for the source/drain contacts. In an exemplary embodiment, recessing the epitaxial source/drain terminals 802 increases the contact area between the source/drain contacts 1104 and the epitaxial source/drain terminals 802 which can reduce contact resistance. In an exemplary embodiment, forming the silicide layer is performed by a silicidation process that includes depositing a metal layer, causing the metal to react with the epitaxy layers or the active fin structures, and removing the un-reacted metal layer. In an exemplary embodiment, the silicide layer can include cobalt silicide ($CoSi_x$), nickel silicide ($NiSi_x$), other suitable silicide layers, and/or combinations thereof.

Figure 12A:
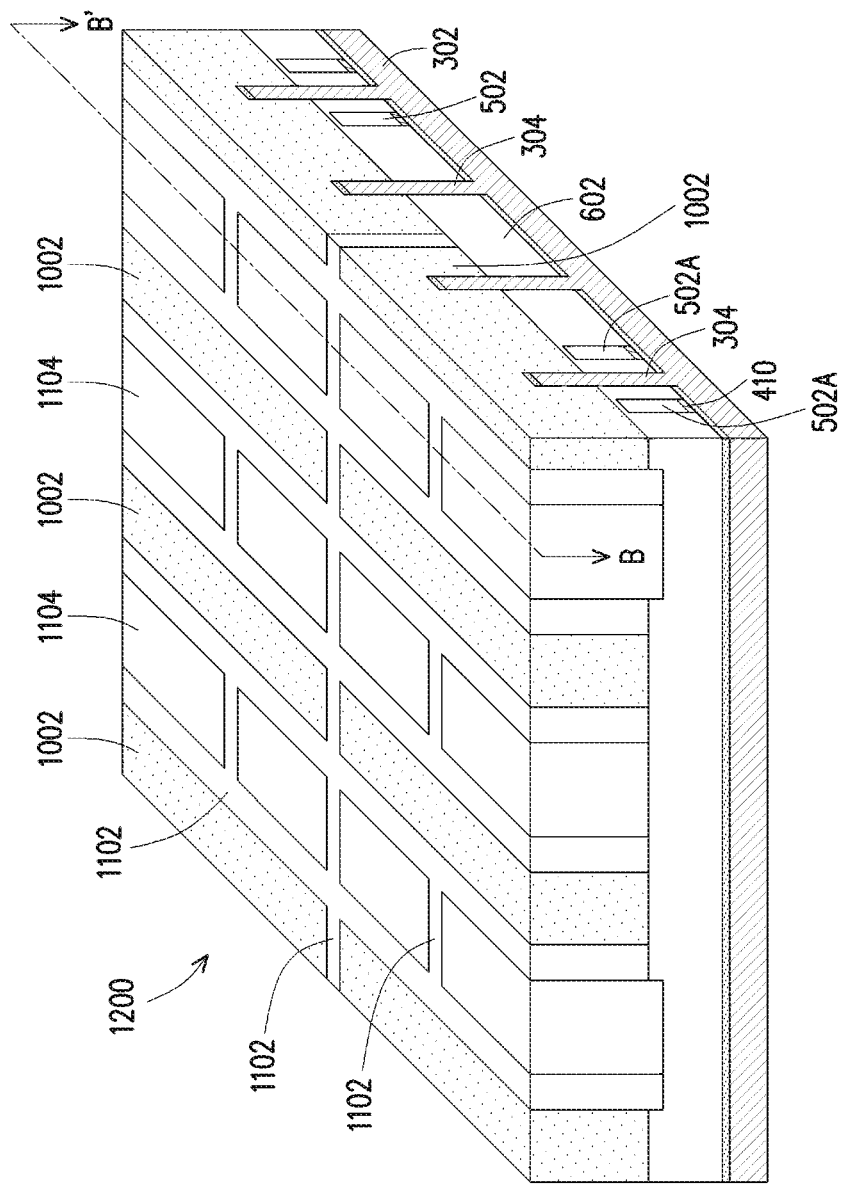
Figure 12B:
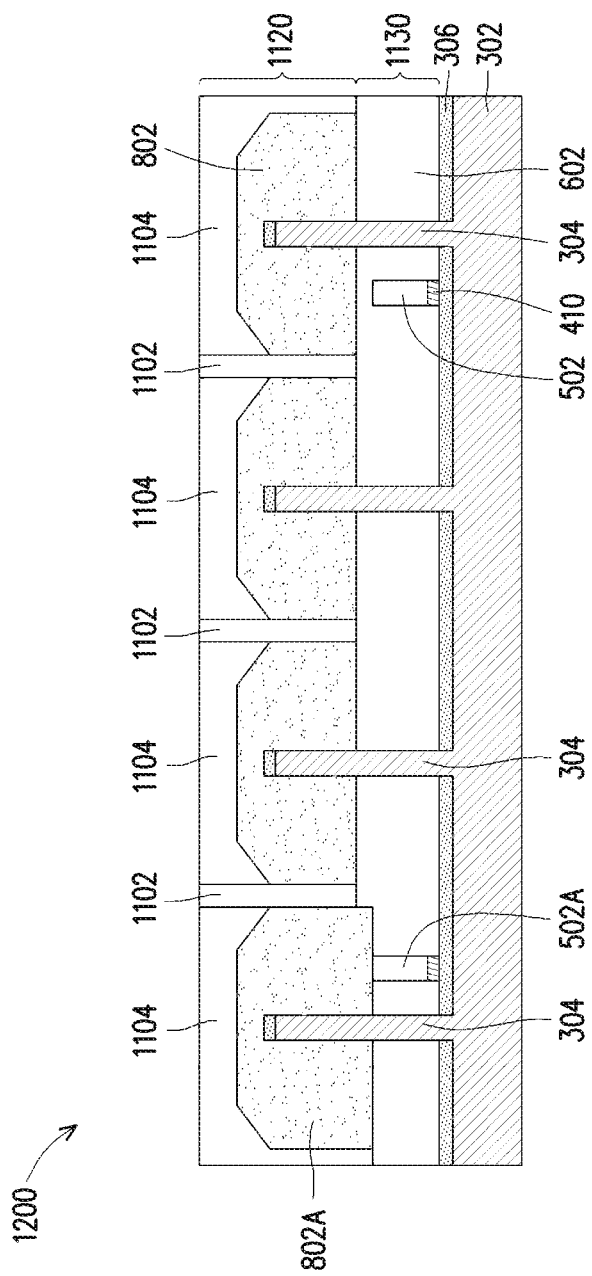

FIG. 12A is an isometric view of a partially-fabricated semiconductor structure after forming metal source/drain contacts according to an exemplary embodiment of the present disclosure. Partially-fabricated semiconductor structure 1200 includes similar structures as partially-fabricated semiconductor structure 1100 of FIG. 11A. FIG. 12B is a cross-sectional view of partially-fabricated semiconductor structure 1200 along the B-B' line illustrated in FIG. 12A. The discussion below of elements of partially-fabricated semiconductor structure 1200 in FIG. 12A applies to elements in FIG. 12B with the same annotations unless mentioned otherwise. It will be recognized that the views of partially-fabricated semiconductor structure 1200 are shown for illustration purposes and may not be drawn to scale. As illustrated in FIGS. 12A-12B, epitaxial source/drain terminal 802A is electrically connected to metal rail conductor 502A embedded in partially-etched ILD 602.

As illustrated in FIGS. 12A-12B, partially-fabricated semiconductor structure 1200 includes the metal rail conductors 502 formed on one side of the fin structures 304. The metal rail conductors 502 shown in FIGS. 12A-12B can be formed using processes similar to the processes described above with reference to FIGS. 3-11B, however, the processes to form the metal rail conductors 502 can occur on one side of the fin structures 304. For example, for each fin structure 304, the fabrication process can form the seed layer structures 310 on one of the spacers 308 rather than on both spacers. Therefore, subsequent fabrication processes would form one metal rail conductor 502 for each fin structure 304. In an exemplary embodiment, the one metal rail conductor 502A can be used to connect the source/drain terminals of the finFETs arrays, for example, source/drain terminal 802A. It should be noted that finFET arrays are provided merely as examples, however, metal rail structures can also be formed in any other semiconductor structures without departing from the scope of the present disclosure.

FIGS. 13-15A are isometric views of partially-fabricated semiconductor structures where metal conductor rail structures formed in interlayer dielectric materials can be used to provide electrical connection between multiple gate structures of finFET arrays.

Figure 13:
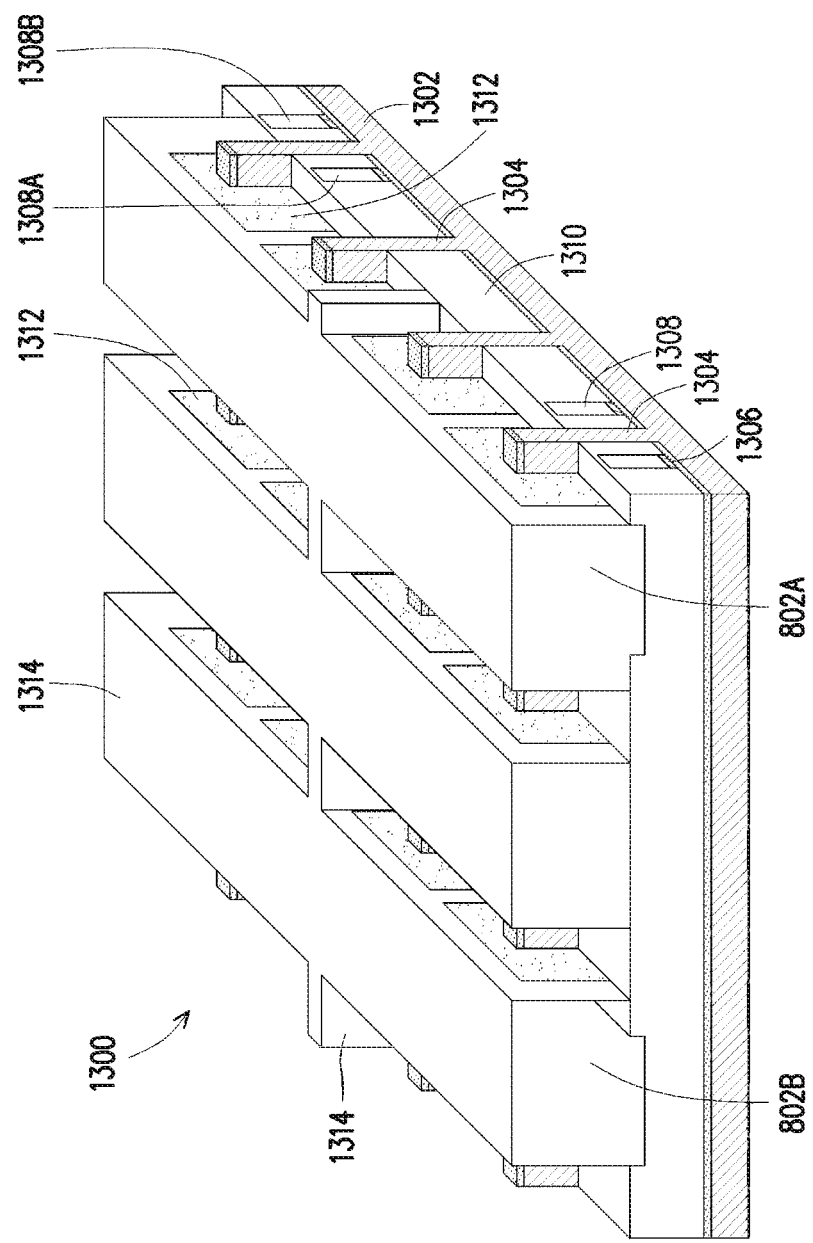
FIGS. 13-15C are isometric views of partially-fabricated semiconductor structures where metal conductor rail structures formed in interlayer dielectric materials can be used to provide electrical connection between multiple gate structures of finFET arrays.

FIG. 13 is an isometric view of a partially-fabricated semiconductor structure after forming removing the poly gate material according to an exemplary embodiment of the present disclosure. Partially-fabricated semiconductor structure 1300 includes structures similar to the structures formed in FIGS. 3-9. For example, partially-fabricated semiconductor structure 1300 includes a substrate 1302, fin structures 1304, partially-removed seed layer structures 1306, metal rail conductors 1308, partially-etched ILD 1310, epitaxial source/drain terminals 1312, and STI structures 1314 that are similar to their respective structures in FIGS. 3-9. In an exemplary embodiment, partially-fabricated semiconductor structure 1300 can be formed after removing the poly gate structures 604 of FIG. 9. In an exemplary embodiment, other processes and methods to form partially-fabricated semiconductor structure 1300 can be used. Poly gate structures can be removed by any suitable removal process such as, for example, a dry RIE etch process, a wet etch process, other suitable removal processes, and/or combinations thereof In an exemplary embodiment, the removal process can be a self-aligned removal process where no patterning process is needed. For example, the removal process can have high etch selectivity of the poly gate material over other exposed structures so a mask material is not needed to shield the other exposed structures. In an exemplary embodiment, exposed structures other than the poly gate structures can be covered to provide further protection from the removal process. The removal process can continue until the poly gate material is completely removed and the underlying fin structures 1304 and partially-etched ILD 1310 are exposed, as illustrated in FIG. 13. After the removal process, metal rail conductors 1308 remain under partially-etched ILD 1310. For example, metal rail conductors 1308A and 1308B are protected by partially-etched ILD 1310 and not exposed to the etching process.

Figure 14:
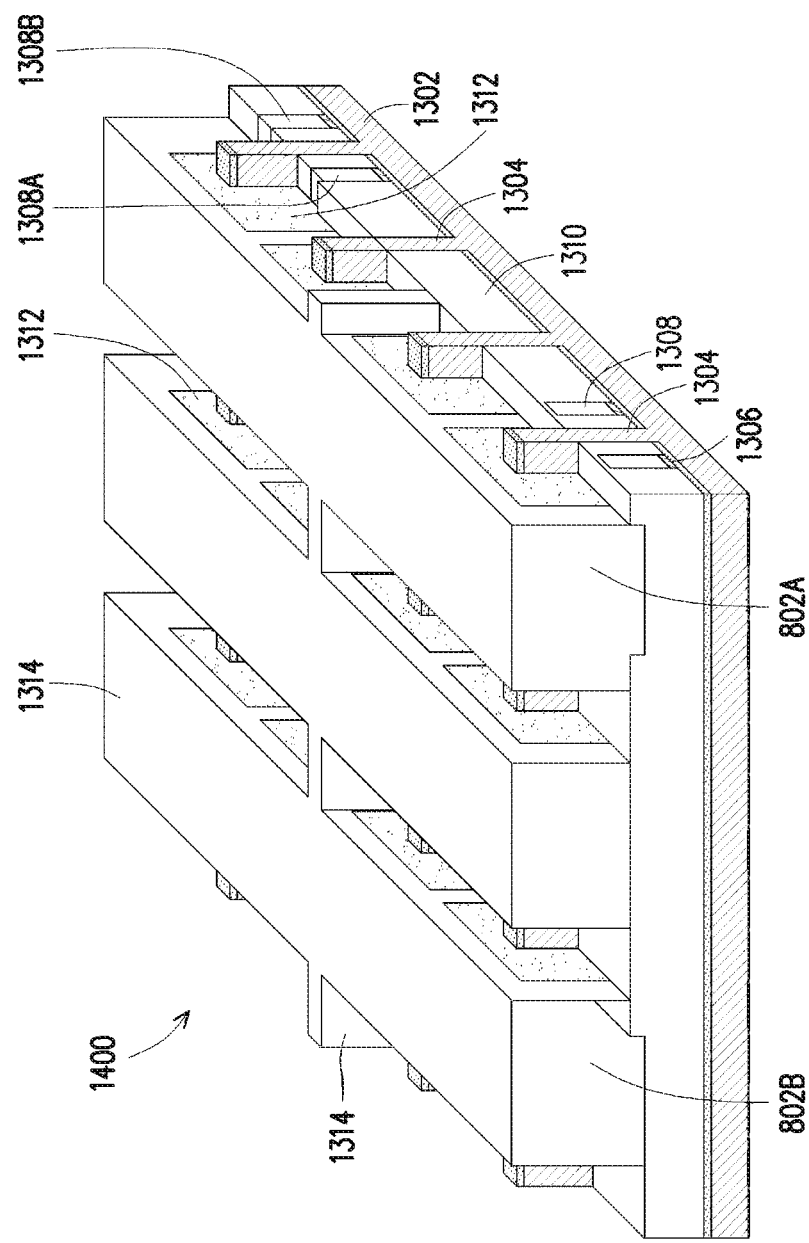

FIG. 14 is an isometric view of a partially-fabricated semiconductor structure after opening a trench in the partially-etched ILD to expose portions of metal rail conductors according to an exemplary embodiment of the present disclosure. Partially-fabricated semiconductor structure 1400 includes a substrate 1302, fin structures 1304, partially-removed seed layer structures 1306, metal rail conductors 1308, partially-etched ILD 1310, epitaxial source/drain terminals 1312, STI structures 1314, and trenches 1402 formed in the partially-etched ILD 1310.

In the exemplary embodiment illustrated in FIG. 14, the trenches 1402 are formed in selective openings where poly gate material has been removed. Similar to the trenches 702, the trenches 1402 are used to expose portions of one or more metal rail conductors 1308 such that subsequent structures (e.g., gate electrodes) can form direct electrical contact with metal rail conductors 1308. The specific metal rail conductors 1308 to be exposed depend on circuit designs and can be one or more metal rail conductors 1308 of the partially-fabricated semiconductor structure. In an exemplary embodiment, the fabrication process to expose selected metal rail conductors 1308 can be similar to the fabrication process described above with reference to FIGS. 7A and 7B. As illustrated in FIG. 14, portions of metal rail conductors 1308A and 1308B are exposed by forming the trenches 1402. The trench forming process can be similar to the trench forming process described above with reference to FIG. 7A and FIG. 7B, for example, the trench forming process can include patterning and removing portions of partially-etched ILD 1310.

Figure 15A:
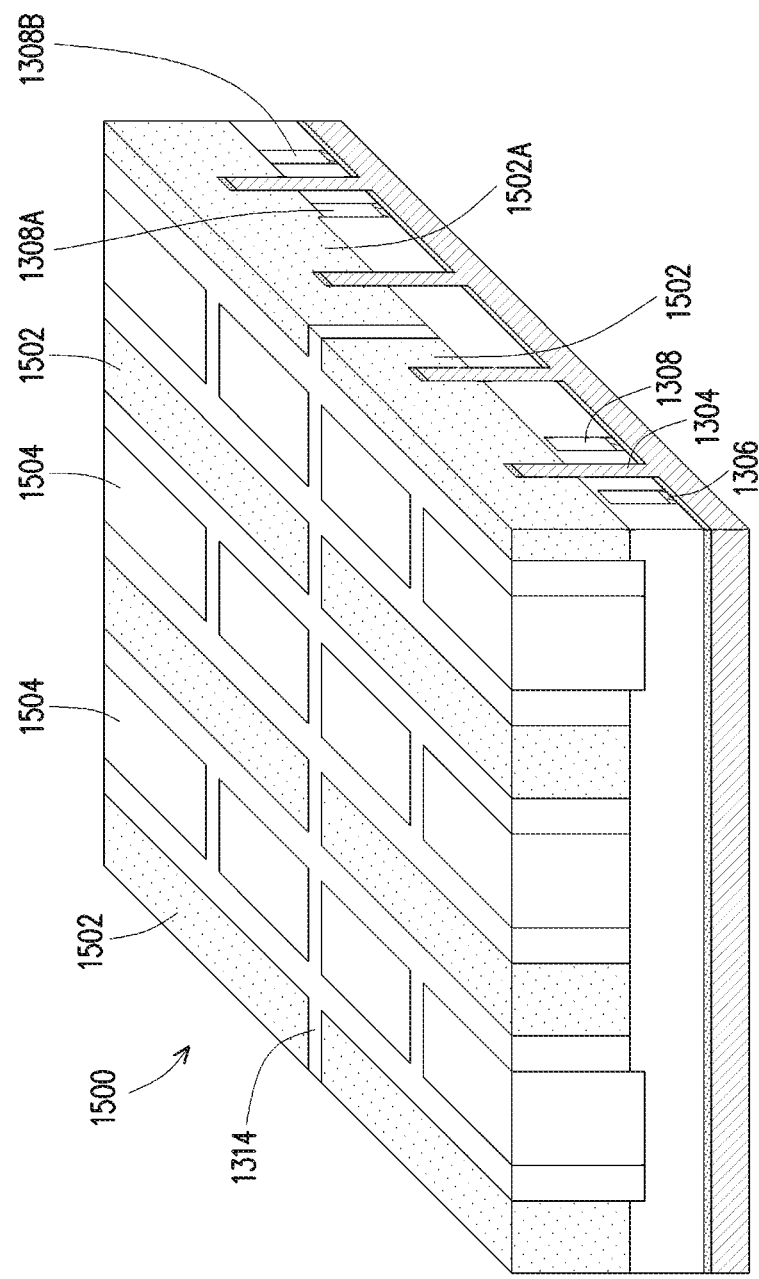
Figure 15B:
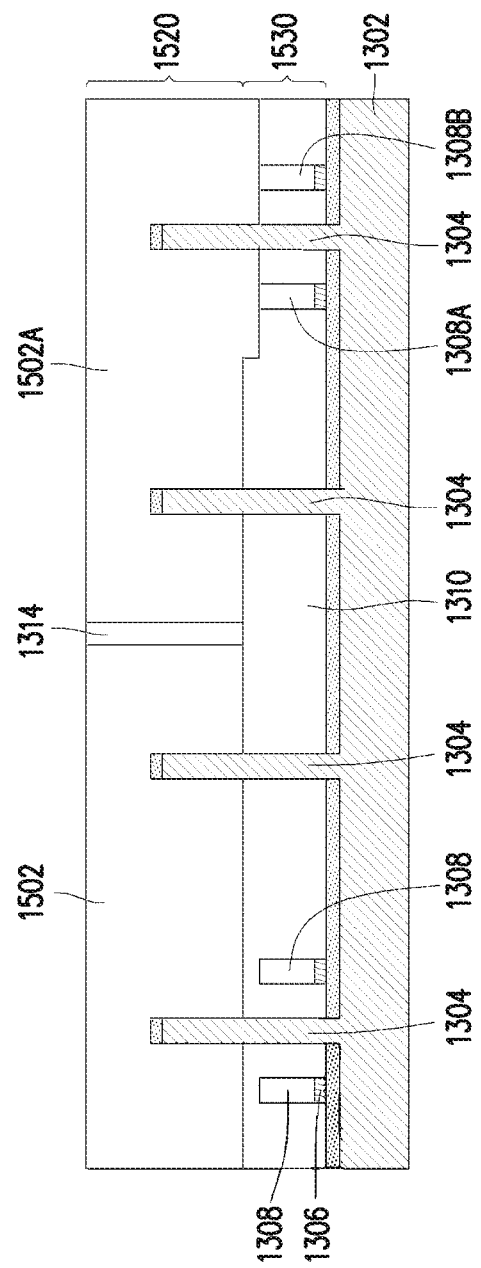
Figure 15C:
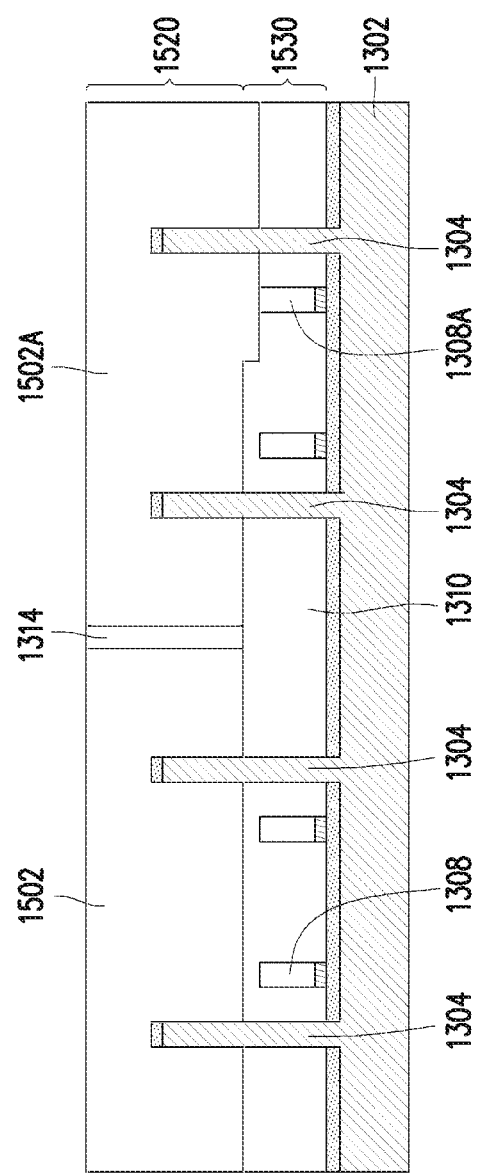

FIG. 15A is an isometric view of a partially-fabricated semiconductor structure after depositing metal gate material and forming source/drain contacts according to an exemplary embodiment of the present disclosure. Partially-fabricated semiconductor structure 1500 includes the substrate 1302, the fin structures 1304, the partially-removed seed layer structures 1306, the metal rail conductors 1308, the partially-etched ILD 1310, the STI structures 1314, metal gate structures 1502, and source/drain contacts 1504. FIG. 15B is a cross-sectional view of partially-fabricated semiconductor structure 1500. In some embodiments, metal gate structures 1502A can be electrically connected to one or more metal rail conductors 1308A embedded in partially-etched ILD 1310. FIG. 15C illustrates a partially-fabricated semiconductor structure having single metal rail conductors formed adjacent to each fin structure.

In the exemplary embodiment illustrated in FIGS. 15A-15B, the conductive material used to form the metal gate structures 1502 can be blanket deposited followed by a planarization process. In an exemplary embodiment, the deposition of conductive material and formation of metal gate structures 1502 can be similar to the formation of the metal gate structures 1002 as described above with reference to FIG. 10. In an exemplary embodiment, other formation processes can be used. After metal gate structures 1502 are formed, one or more metal gate structures 1502 can be electrically connected to metal rail conductors directly. For example, metal gate structure 1502A is formed around one of the fin structures 1304 and also in trench 1402, directly connecting to underlying metal rail conductors 1308A and 1308B. As shown in FIG. 15B, the protruding portions of the fin structures 1304 represent active fin portions 1520 of the fin that are used to form the channel and source/drain regions of the finFET devices. The portions of the fin structures 1304 buried in partially-etched ILD 602 represent non-active fin portions 1530 of the fin. Metal gate structures 1502 can be formed on active fin regions 1520 of fin structures 1304 and above non-active fin regions 1530. In some embodiments, a single metal rail conductor 1308A is formed adjacent to fin structure 1304, as illustrated in FIG. 15C, and metal gate structure 1502A is electrically connected to metal rail conductor 1308A. In an exemplary embodiment, other metal gate structures 1502 can be connected to metal rail conductors 1308A and 1308B. Because the metal rail conductors are formed within the ILD layer, they can electrically connect multiple metal gate structures without occupying additional device space.

In the exemplary embodiment illustrated in FIG. 15A, the source/drain contacts 15 04 can be metallic contacts that are formed directly on the epitaxial source/drain terminals 13 12 and used to provide electrical connection to the epitaxial source/drain terminals 1312. Similar to forming the source/drain contacts 1104 described above with reference to FIGS. 11A-11B, patterning and etching processes can be used to form openings in the STI structures 1314 for the deposition of source/drain contact material. In an exemplary embodiment, portions of STI material can be removed from between opposing metal gate structures 1502 to expose underlying epitaxial source/drain terminals 1312. In an exemplary embodiment, STI material remains between adjacent fins to provide electrical isolation.

Figure 16:
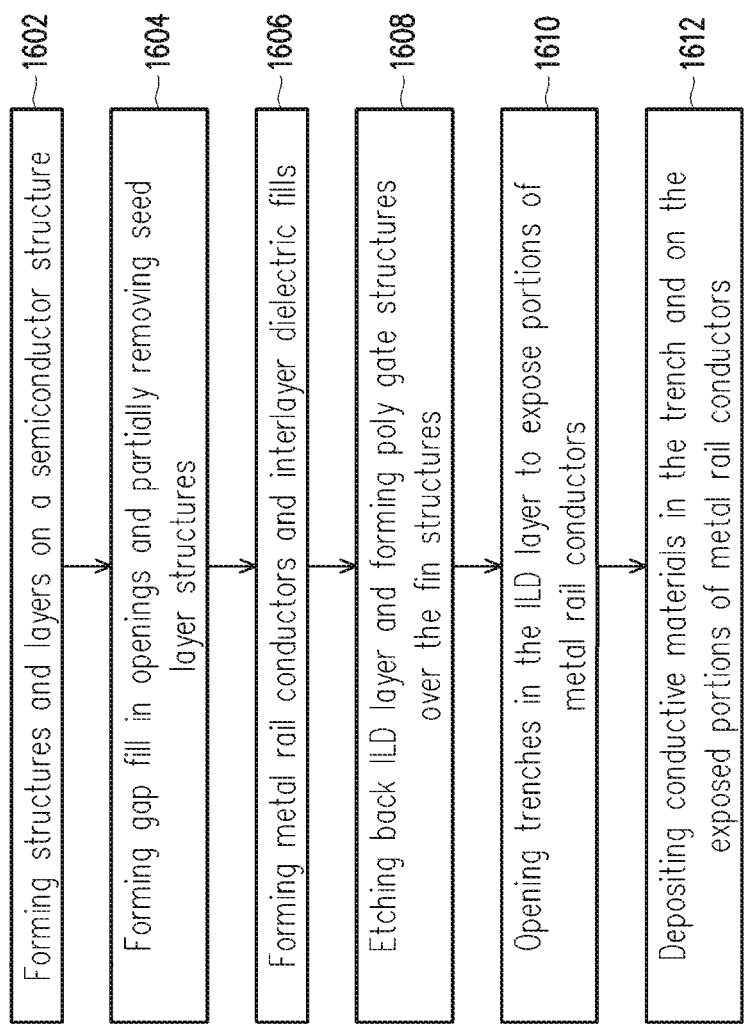
FIG. 16 is a flow diagram of an example method of forming metal rail conductors in an ILD layer according to an exemplary embodiment of the present disclosure.

FIG. 16 is a flow diagram of an example method of forming metal rail conductors in an ILD layer according to an exemplary embodiment of the present disclosure. Other operations in method 1600 can be performed and operations of method 1600 can be performed in a different order and/or vary.

At operation 1602, structures and layers are formed on and/or within a semiconductor structure, in accordance with some embodiments. The semiconductor structure includes portions of finFETs. For example, the semiconductor structure includes a semiconductor substrate, fin structures, hard masks, dielectric spacers, and seed layer structures. The semiconductor substrate can be a silicon semiconductor substrate, according to some embodiments. In an exemplary embodiment, the semiconductor substrate can be a semiconductor on insulator (SOI). In an exemplary embodiment, the semiconductor substrate can be an epitaxial material. An example of a semiconductor substrate is the semiconductor substrate 302 described in FIG. 3. Fin structures represent active regions where one or more transistors are formed. The fin structures can include silicon or another elementary semiconductor. The fin structures can be fabricated using suitable processes including patterning and etch processes. The fin structures can include epitaxial material, in accordance with some embodiments. The fin structures can represent an exemplary embodiment of the fin structures 304 as described above in FIG. 3. The hard masks can be used to form the fin structures. The hard masks can also be used protect the fin structures during subsequent processing steps. In an exemplary embodiment, the hard masks are formed on the top surfaces of the fin structures. The hard masks can also be formed between the fin structures and on top surfaces of the semiconductor substrate. The hard masks can made of a dielectric material. An example of the hard mask is hard mask 306 described above with reference to FIG. 3. The isolation spacers can partially fill the recesses between fin structures and formed on the sidewalls of fin structures. In an exemplary embodiment, the isolation spacers can be made of a dielectric material. In an exemplary embodiment, the isolation spacers can be formed by blanket depositing an isolation material over the exposed surfaces and using an anisotropic etching process to remove horizontal portions of the deposited isolation layer. An example of isolation spacers are the isolation spacers 308 described above with reference to FIG. 3. The seed layer structures are formed on the sidewalls of the isolation spacer. In an exemplary embodiment, the seed layer structures can be formed of silicon material. The seed layer structures can have a different etch selectivity as isolation spacers. An example of seed layer structures can be the seed layer structures 310 described above with reference to FIG. 3. The length of the seed layer structures, measured along a length of the fin structures, can vary based on device needs, for example, the length of subsequently formed metal drain channels. The top surfaces of the hard masks, the isolation spacers, and the seed layer structures can be substantially at the same level by performing suitable planarization processes on the top surfaces of these structures.

At operation 1604, gap fill is formed in openings and seed layer structures are partially removed, in accordance with some embodiments. Gap fill structures can fill the openings formed in the structure described in operation 1602 above. The gap fill structures can fill the openings formed between any adjacent structures such as, for example, between adjacent fin structures, between opposing fin structures and seed layer structures, between opposing seed layer structures, and/or other openings between structures. In an exemplary embodiment, the gap fill structures can be made of a dielectric material similar to the isolation spacers. In an exemplary embodiment, the gap fill structures can be formed by blanket depositing a gap fill material over the exposed surfaces and in the openings and performing a planarization process to remove the excessive gap fill material.

At operation 1606, metal rail conductors and interlayer dielectric fills are formed, in accordance with some embodiments. The metal rail conductors can be formed on the seed layer structures. In an exemplary embodiment, the metal rail conductors can be formed of any suitable materials such as tungsten, cobalt, copper, aluminum, other suitable materials, and/or combinations thereof. The metal rail conductors can be formed using partially-removed seed layers as a seed layer where the growth of metal rail conductors is started. For example, the metal rail conductors can start forming from the top surface of partially-removed seed layer until a nominal thickness of the metal rail conductor is achieved. For example, tungsten material can be formed using silicon material as a seed layer. In an exemplary embodiment, the growth of metal rail conductor material can be completed using suitable processes such as CVD, electroplating, electroless plating, other suitable processes, and/or combinations thereof. The height of the metal rail conductors can be in a range between about 0.8 to about 1.2 times the gate pitch of the finFET devices. In an exemplary embodiment, the width of the metal rail conductors can be in a range between about 0.8 to about 2.2 times the width of the fin structures. In an exemplary embodiment, the pitch of the metal rail conductors (i.e., the distance between centers of adjacent metal rail conductors) can be in a range between about 0.8 to about 1.2 times the fin pitch. An example of the metal rail conductors can be the metal rail conductors 502 described above with reference to FIGS. 5A and 5B. After the metal rail conductors are formed, dielectric fills are formed over the metal rail conductors and filling the openings within the gap fill structures. In an exemplary embodiment, the dielectric fills can be formed by performing a blanket deposition of dielectric fill material followed by a planarization process. An example of dielectric fills is the dielectric fills 504.

At operation 1608, the ILD layer is etched back and poly gates are formed over the fin structures, in accordance with some embodiments. The ILD layer is uniformly etched back until a nominal depth is achieved. In an exemplary embodiment, the etching process can be an isotropic etching process. After the etching process, portions of the fin structures can protrude from the top surfaces of the remaining ILD layer. The amount of the ILD layer removed determines the height of active fin structures and can depend upon at least on the functionality requirements of the finFET devices. The etching back process can be similar to the etching back process described above with reference to FIG. 6. After the ILD layer is partially etched, poly gate structures are formed on the exposed surfaces of the fin structures, including top surfaces and sidewall surfaces not covered by the ILD layer. The poly gate structures can include a gate dielectric layer, a gate electrode structure, and/or one or more additional layers, according to some embodiments. In an exemplary embodiment, the poly gate structure uses polysilicon as the gate electrode structure. In an exemplary embodiment, the poly gate pitch (i.e., the distance between centers of adjacent poly gate structures) can be in a range between about 10 nm to about 300 nm. In an exemplary embodiment, the poly gate length can be in a range between about 3 nm to about 80 nm.

At operation 1610, trenches are opened in the ILD layer to expose portions of metal rail conductors, in accordance with some embodiments. In an exemplary embodiment, trenches can be formed between adjacent poly gate structures and in the ILD layer such that subsequent source/drain terminals can electrically contact the metal rail conductors. Examples of the trenches formed between adjacent poly gate structures can be the trenches 702 described above with reference to FIGS. 7A and 7B. In an exemplary embodiment, trenches can be formed in the ILD layer such that subsequent metal gate structures can electrically contact the metal rail conductors. For example, trenches can be formed after removing the poly gate structure and prior to forming the metal gate structures. Source/drain terminals and STI regions are also formed during the process and similar to the process described with reference to FIGS. 11A-13 above. Examples of trenches that exposed metal rail conductor below the metal gate structures can be the trenches 1402 described above in FIG. 14.

At operation 1612, conductive materials are deposited in the trench and on the exposed portions of metal rail conductors, in accordance with some embodiments. In an exemplary embodiment, conductive materials such as one or more source and drain terminals directly contact and are electrically connected to the exposed metal rail conductors. For example, the epitaxial source/drain terminals 802 A and 802B of the epitaxial source/drain terminals 802 described in FIG. 8 respectively connects to metal rail conductor regions 502A and 502B. Although only the epitaxial source/drain terminals 802A and 802B are shown to be connected in FIG. 8, other source/drain terminals can also be connected depending on the design and device needs. In an exemplary embodiment, conductive materials such as one or more metal gate structures directly contact and are electrically connected to the exposed metal rail conductors. For example, metal gate structure 1502A described above in FIG. 15A is formed around one of the fin structures 1304 and also in trench 1402, directly connecting to underlying metal rail conductors 1308A and 1308B. Because the metal rail conductors are formed within the ILD layer, they can electrically connect multiple metal gate structures or multiple source/drain terminals without occupying additional device space.

Figure 17:
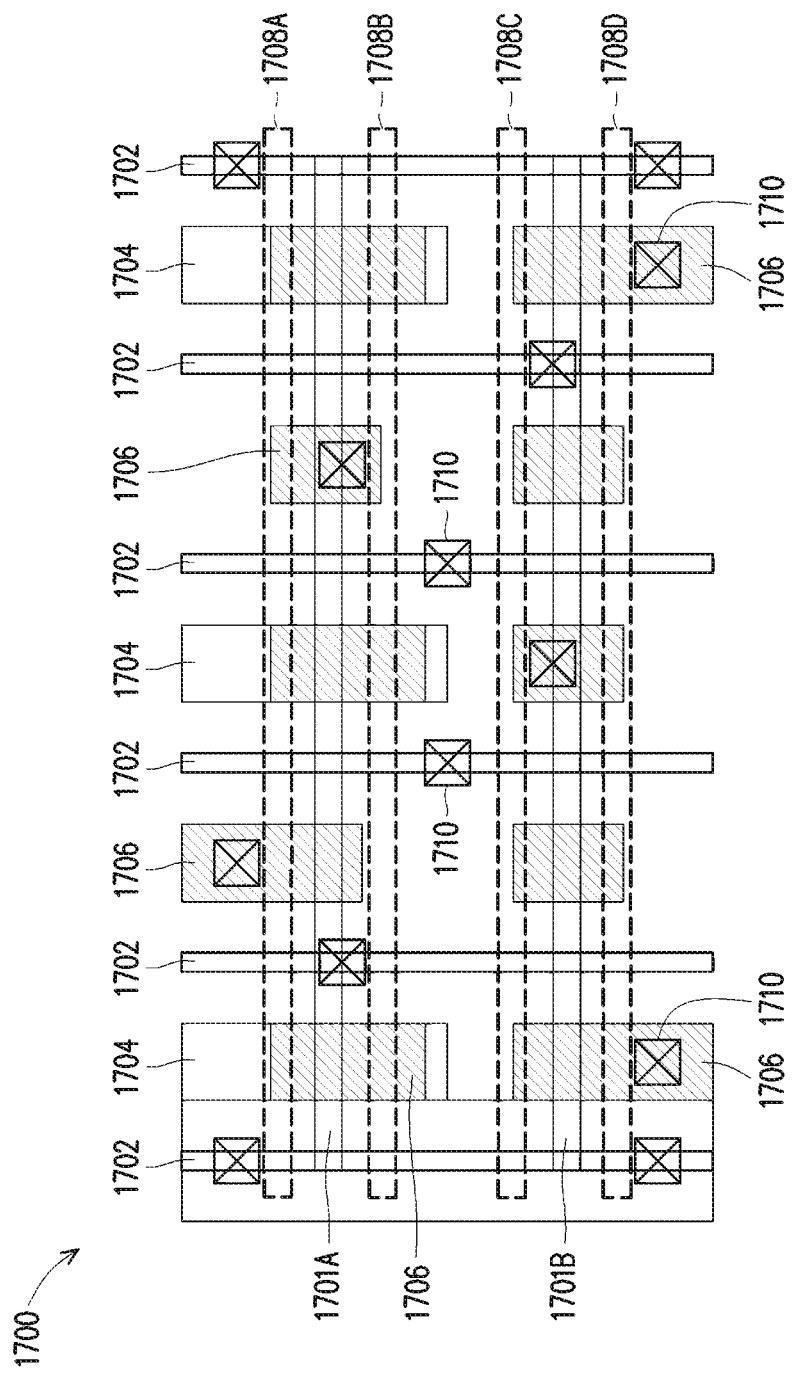
FIGS. 17-20 are cell layout diagrams of semiconductor structures, where metal conductor rail structures can be used to provide electrical connection between multiple gate/source/drain terminals of finFET arrays according to exemplary embodiments of the present disclosure.
Figure 18:
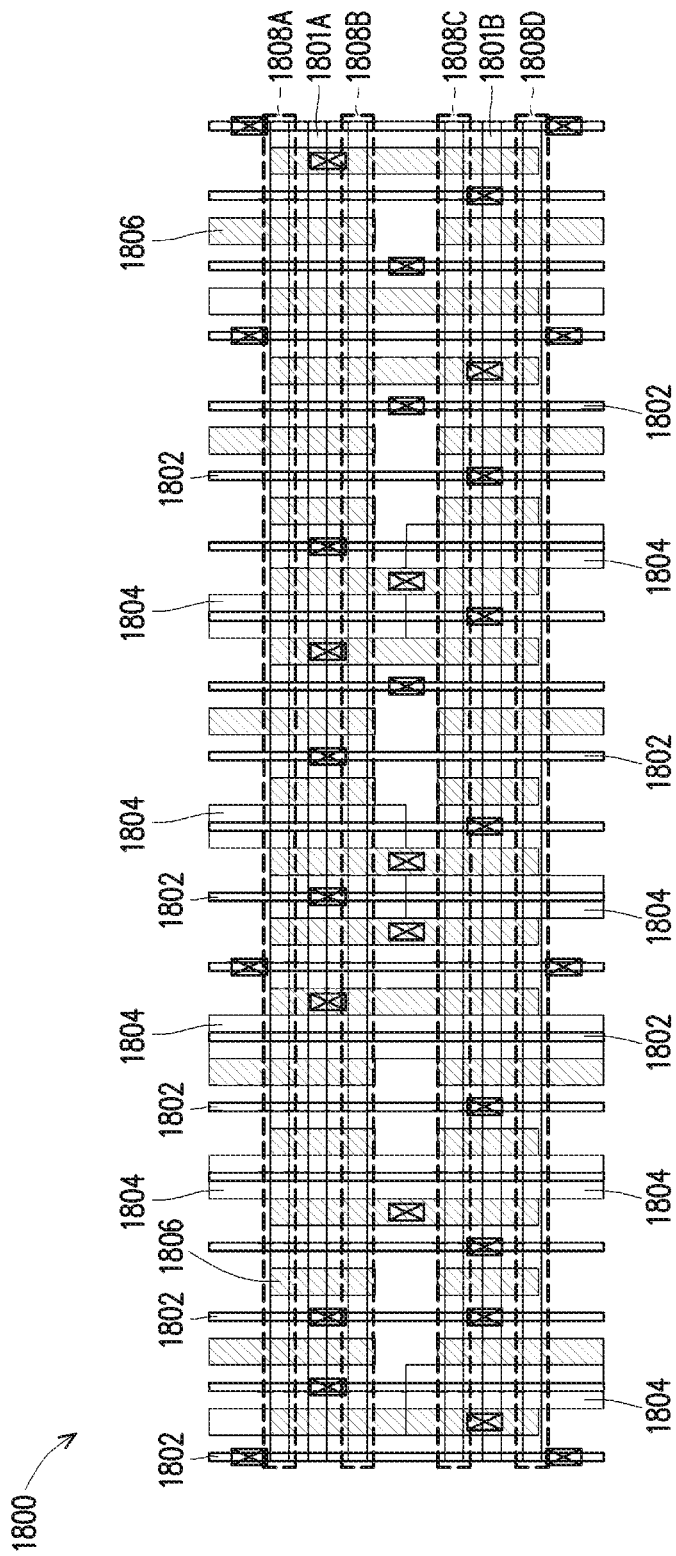

FIG. 17 and FIG. 18 are cell layout diagrams of portions of semiconductor finFET arrays where dual metal rail conductor structures can be used to provide electrical connection between multiple conductive structures such as gate/source/drain terminals, according to exemplary embodiments of the present disclosure.

FIG. 17 illustrates dual metal rail conductors that provide electrical connection between multiple source/drain terminals, according to exemplary embodiments of the present disclosure. The cell layout diagram 1700 illustrate semiconductor finFET arrays and include fins 1701A and 1701B, poly gate structures 1702, contact openings 1704, source/drain contacts 1706, metal rail conductors 1708A-1708D, and vias 1710. Source/drain contacts are respectively situated in source/drain regions in the cell layout diagrams of the portions of semiconductor finFET arrays. Other structures can be included in the finFET arrays and are not illustrated here in the cell layout diagrams for simplicity purposes. As illustrated in FIG. 17, metal rail conductors 1708A and 1708B are formed adjacent to and in parallel (e.g., extending in the same direction) with fin 1701A. Similarly, metal rail conductors 1708C and 1708D are formed adjacent to and in parallel with fin 1701B. A plurality of poly gate structures 1702 are formed on and in perpendicular with fins 1701A and 1701B. Source/drain contacts 1706 are formed between adjacent poly gate structures 1702. Contact openings 1704 can be used to expose portions of metal rail conductors 1708A-1708D from the dielectric layer (not illustrated in FIG. 17) such that subsequently formed source/drain contacts 1706 can be electrically connected. The dielectric layer is situated in a dielectric region in the cell layout diagram. In some embodiments, fins 1701A and 1701B can be similar to fins 304 described above with reference to FIG. 3A through FIG. 11B. Similarly, poly gate structures 1702 can be similar to poly gate structure 1002. Contact openings 1704 can be similar to trenches 702 illustrated in FIG. 7B. Metal rail conductors 1708A-1708D can be similar to metal rail conductors 502 as illustrated in FIG. 3A through FIG. 11B. Vias 1710 can be used to provide electrical connection between different layers of the finFET array, for example, vias 1710 can be used to connect source/drain contacts or poly gate structures to an MO layer of the semiconductor structure. M0 metal lines can be metal lines in a metal 0 layer of a back-end-of-line (BEOL) interconnect structure. For example, MO metal lines can be local interconnects that represent a first interconnect level and electrically connect to underlying finFET arrays through one or more vias.

FIG. 18 illustrates dual metal rail conductors that provide electrical connection between multiple poly gate terminals, according to exemplary embodiments of the present disclosure. The cell layout diagram 1800 illustrate semiconductor finFET arrays and include fins 1801A and 1801B, poly gate structures 1802, contact openings 1804, source/drain contacts 1806, metal rail conductors 1808A-1808D, and vias 1810. Other structures can be included in the finFET arrays and are not illustrated here in the cell layout diagrams for simplicity purposes. Metal rail conductors 1808A and 1808B are formed adjacent to and in parallel (e.g., extending in the same direction) with fin 1801A, and metal rail conductors 1808C and 1808D are formed adjacent to and in parallel with fin 1801B. A plurality of poly gate structures 1802 are formed on and in perpendicular with fins 1801A and 1801B. Source/drain contacts 1806 are formed between adjacent poly gate structures 1802. Contact openings 1804 can be used to expose portions of metal rail conductors 1808A-1808D from the dielectric layer (not illustrated in FIG. 18) such that subsequently formed one or more specific poly gate structures can be electrically connected through the metal rail conductors.

Figure 19:
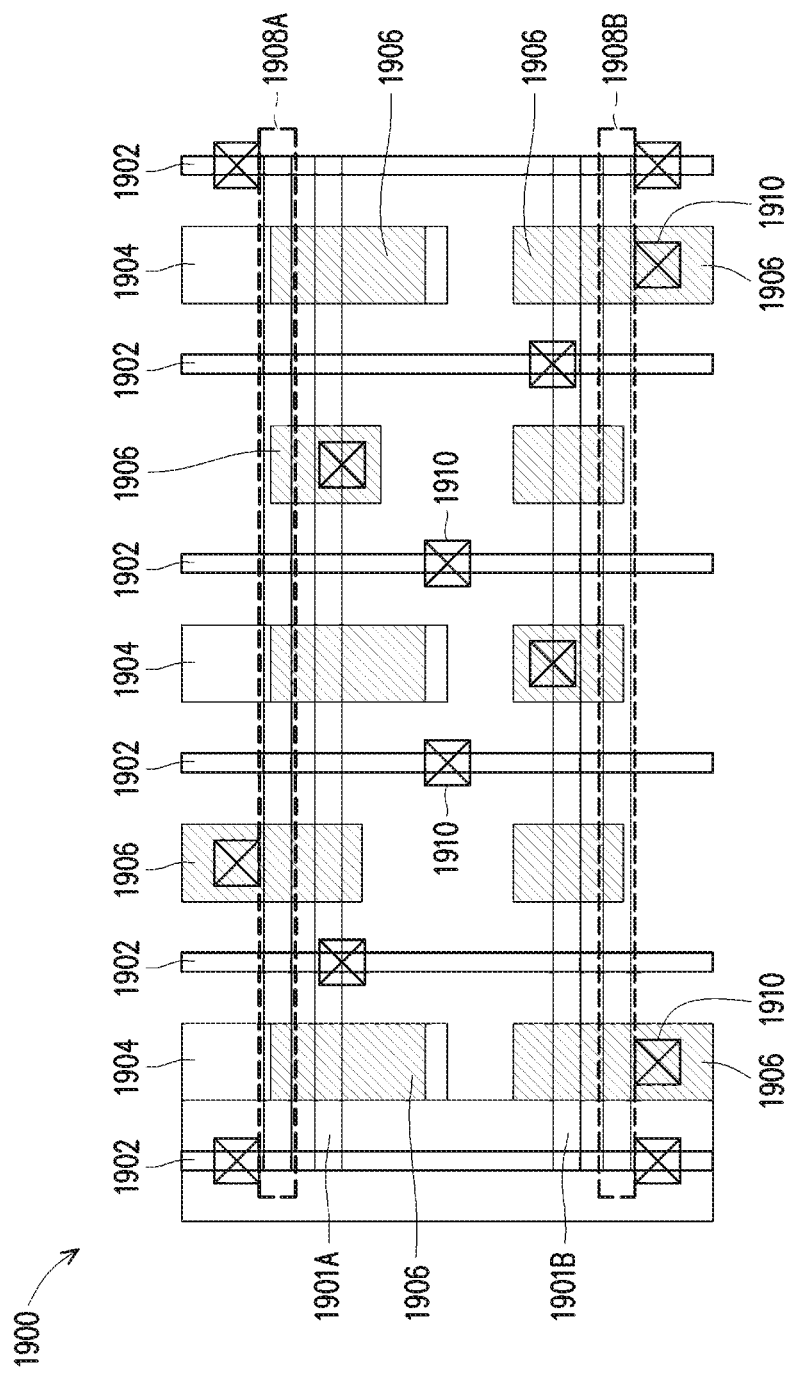
Figure 20:
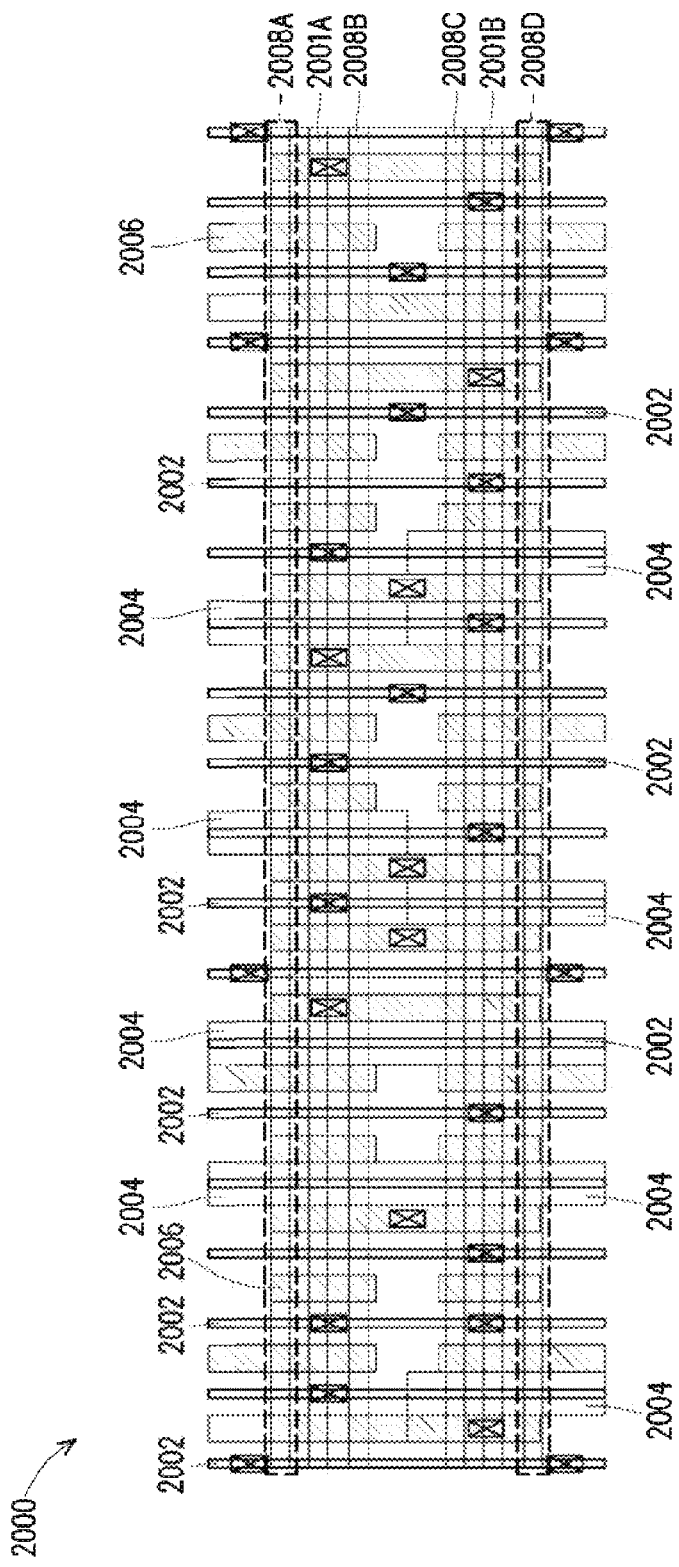

FIG. 19 and FIG. 20 are cell layout diagrams of portions of semiconductor finFET arrays where a single metal rail conductor structure can be used to provide electrical connection between multiple gate/source/drain terminals, according to exemplary embodiments of the present disclosure.

The cell layout diagram 1900 illustrate semiconductor finFET arrays and include fins 1901A and 1901B, poly gate structures 1902, contact openings 1904, source/drain contacts 1906, metal rail conductors 1908A and 1908B, and vias 1910. Other structures can be included in the finFET arrays and are not illustrated here in the cell layout diagrams for simplicity purposes. The structures illustrated in FIG. 19 can be similar to the corresponding structures illustrated above in FIG. 17, however, each fin 1901A and 1901B in FIG. 19 respectively includes a single metal rail conductor 1908A and 1908B. Contact openings 1904 can be used to expose portions of metal rail conductors 1908A and 1908B from the dielectric layer (not illustrated in FIG. 19) such that subsequently formed source/drain contacts 1906 can be electrically connected.

FIG. 20 illustrates single metal rail conductor that provides electrical connection between multiple poly gate terminals, according to exemplary embodiments of the present disclosure. The cell layout diagram 2000 illustrate semiconductor finFET arrays and include fins 2001A and 2001B, poly gate structures 2002, contact openings 2004, source/drain contacts 2006, metal rail conductors 2008A-2008D, and vias 2010. Other structures can be included in the finFET arrays and are not illustrated here in the cell layout diagrams for simplicity purposes. Metal rail conductors 2008A and 2008B are formed adjacent to and in parallel with fin 2001A, and metal rail conductors 2008C and 2008D are formed adjacent to and in parallel with fin 2001B. A plurality of poly gate structures 2002 are formed on and in perpendicular with fins 2001A and 2001B. Source/drain contacts 2006 are formed between adjacent poly gate structures 2002. Contact openings 2004 can be used to expose portions of metal rail conductors 2008A-2008D from the dielectric layer (not illustrated in FIG. 20) such that subsequently formed one or more specific poly gate structures can be electrically connected through the metal rail conductors.

CONCLUSION

The foregoing Detailed Description discloses a non-planar semiconductor device. The non-planar semiconductor device includes a dielectric region formed on a substrate, multiple terminal regions situated onto the dielectric region, and a rail conductor situated within the dielectric region. The rail conductor is electrically connected to a first terminal region from among the multiple terminal regions.

The foregoing Detailed Description additionally discloses an integrated circuit. The integrated circuit includes a dielectric region, a first fin field-effect transistor (finFET), having a first source region, a first gate region, and a first drain region, a second finFET having a second source region, a second gate region, and a second drain region, situated onto the dielectric region, and a rail conductor situated within the dielectric region. The rail conductor is electrically connected to a first terminal region selected from among the first source region, the first gate region, the first drain region, the second source region, the second gate region, or the second drain region.

The foregoing Detailed Description further discloses a fin field-effect transistor (finFET). The finFET includes a semiconductor substrate, a dielectric region situated above the semiconductor substrate, a source region situated onto the dielectric region, a gate region situated onto the dielectric region, a drain region situated onto the dielectric region, a fin structure situated onto the semiconductor substrate and traversing through the dielectric region, and a rail conductor situated within the dielectric region. The fin structure is between the source region and the drain region and to traverse through the gate region. The rail conductor is parallel to the fin structure and to be extend a horizontal length of the semiconductor substrate The foregoing Detailed Description referred to accompanying figures to illustrate exemplary embodiments consistent with the disclosure. References in the foregoing Detailed Description to "an exemplary embodiment" indicates that the exemplary embodiment described can include a particular feature, structure, or characteristic, but every exemplary embodiment may not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The foregoing Detailed Description is not meant to limiting. Rather, the scope of the disclosure is defined only in accordance with the following claims and their equivalents. It is to be appreciated that the foregoing Detailed Description, and not the following Abstract section, is intended to be used to interpret the claims. The Abstract section can set forth one or more, but not all exemplary embodiments, of the disclosure, and thus, is not intended to limit the disclosure and the following claims and their equivalents in any way.

The exemplary embodiments described within foregoing Detailed Description have been provided for illustrative purposes, and are not intended to be limiting. Other exemplary embodiments are possible, and modifications can be made to the exemplary embodiments while remaining within the spirit and scope of the disclosure. The foregoing Detailed Description has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

Embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing circuitry). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

The foregoing Detailed Description fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. A method, comprising:
    forming a plurality of fins protruding from a first dielectric layer;
    forming first and second seed layers on the first dielectric layer, wherein a fin of the plurality of fins is between the first and second seed layers;
    depositing a second dielectric layer on the first dielectric layer and in contact with the first and second seed layers;
    growing a conductive material using the first and second seed layers to form first and second conductive rails, respectively;
    forming a plurality of terminal regions on the second dielectric layer;
    electrically connecting the first conductive rail to a first terminal region from among the plurality of terminal regions;
    electrically connecting the second conductive rail to a second terminal region from among the plurality of terminal regions;
    electrically connecting a third conductive rail to a third terminal region from among the plurality of terminal regions.

2. The method of claim 1, further comprising depositing first and second spacers on the first dielectric layer and in contact with first and second sidewalls of the fin, respectively.

3. The method of claim 2, wherein forming the first and second seed layers comprises:
    depositing first and second seed structures on the first dielectric layer and in contact with the first and second spacers, respectively; and
    etching back the first and second seed structures.

4. The method of claim 3, wherein:
    depositing the first and second seed structures comprises depositing silicon; and
    growing the conductive material comprises growing tungsten.

5. The method of claim 1, wherein forming the plurality of terminal regions comprises:
    forming a source region;
    forming a drain region; and
    depositing a gate electrode between the source and drain regions.

6. The method of claim 1, further comprising depositing a third dielectric layer on the first and second conductive rails.

7. The method of claim 6, further comprising depositing a hard mask layer on a top surface of the fin.

8. The method of claim 7, further comprising performing a planarization process on the hard mask layer and the second and third dielectric layers.

9. The method of claim 6, further comprising depositing a shallow trench isolation (STI) layer over the first and second conductive rails and the second and third dielectric layers.

10. A method, comprising:
    forming a fin protruding from a first dielectric layer;
    depositing a spacer on a sidewall of the fin and on the first dielectric layer;
    depositing a seed material on the first dielectric layer and on a sidewall of the spacer;
    etching back the seed material to form a seed layer;
    growing a conductive material using the seed layer to form a conductive rail;
    depositing a dielectric material on the conductive rail;
    performing a planarization process on the dielectric material;
    forming a terminal region on the second dielectric layer; and
    electrically connecting the conductive rail to the terminal region.

11. The method of claim 10, further comprising patterning and etching the seed material to reduce a lateral length of the seed material.

12. The method of claim 10, wherein depositing the seed material comprises depositing silicon.

13. The method of claim 12, wherein growing the conductive material comprises growing tungsten.

14. The method of claim 10, further comprising:
    forming an other conductive rail;
    forming an other terminal region on the second dielectric layer; and
    electrically connecting the other conductive rail to the other terminal region.

15. The method of claim 10, wherein forming the terminal region comprises forming at least one of:
    a source region;
    a drain region; or a gate electrode.

16. A method, comprising:
    forming first and second fins;
    forming a seed material between the first and second fins;
    etching back the seed material to form a seed layer;
    growing a conductive material using the seed layer to form a conductive rail, wherein a top surface of the conductive rail is below top surfaces of the first and second fins;
    depositing an inter-layer dielectric (ILD) layer on the first fin, the second fin, and the conductive rail; and
    performing a planarization process on the ILD layer such that top surfaces of the first fin, the second fin, and the ILD layer are substantially coplanar.

17. The method of claim 16, further comprising:
    forming a terminal region on the ILD layer; and
    electrically connecting the terminal region to the conductive rail.

18. The method of claim 16, wherein forming the seed material comprises depositing a silicon material and etching back the silicon material.

19. The method of claim 18, wherein growing the conductive material comprises growing tungsten on the etched-back silicon material.

20. The method of claim 16, further comprising:
- forming an other conductive rail adjacent to the second fin;
- forming first and second terminal regions in the ILD layer; and
- electrically connecting the first and second terminal regions to the conductive rail and the other conductive rail, respectively.

\* \* \* \* \*

UNITED STATES PATENT AND TRADEMARK OFFICE
CERTIFICATE OF CORRECTION

PATENT NO. : 11,495,687 B2  
APPLICATION NO. : 17/001390  
DATED : November 8, 2022  
INVENTOR(S) : Chen et al.

Page 1 of 1

It is certified that error appears in the above-identified patent and that said Letters Patent is hereby corrected as shown below:

On the Title Page

Item (71), in "Applicant", Line 2, delete "Ltd." and insert -- Ltd., Hsinchu (TW) --, therefor.

Item (72), in "Inventors", Line 5, delete "Hsin Chu" and insert -- Hsinchu --, therefor.

Item (57), under "ABSTRACT", Line 16, after "regions" insert -- of --.

On Page 2, Item (57), under "ABSTRACT", Line 3, after "regions" insert -- of --.

Signed and Sealed this  
Twenty-fourth Day of October, 2023

Katherine Kelly Vidal  
*Director of the United States Patent and Trademark Office*